(12) United States Patent
Ando et al.

(10) Patent No.: US 10,446,738 B2
(45) Date of Patent: Oct. 15, 2019

(54) DISPLACEMENT SENSOR, DISPLACEMENT DETECTING DEVICE, AND OPERATION DEVICE

(71) Applicant: Murata Manufacturing Co., Ltd., Nagaokakyo-shi, Kyoto-fu (JP)

(72) Inventors: Masamichi Ando, Nagaokakyo (JP); Hideki Kawamura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 412 days.

(21) Appl. No.: 15/455,655

(22) Filed: Mar. 10, 2017

(65) Prior Publication Data

US 2017/0186939 A1   Jun. 29, 2017

Related U.S. Application Data

(63) Continuation of application No. 14/032,238, filed on Sep. 20, 2013, now Pat. No. 9,627,605, which is a (Continued)

(30) Foreign Application Priority Data

Apr. 8, 2011 (JP) ................................. 2011-086412
Apr. 28, 2011 (JP) ................................. 2011-101407
May 12, 2011 (JP) ................................. 2011-106990

(51) Int. Cl.
*H01L 41/193* (2006.01)
*H01L 41/113* (2006.01)
(Continued)

(52) U.S. Cl.
CPC ............ *H01L 41/1132* (2013.01); *G01B 7/16* (2013.01); *G01D 5/18* (2013.01); *G01L 1/16* (2013.01);
(Continued)

(58) Field of Classification Search
CPC .............. H01L 41/193; H01L 41/1132; H01L 41/1134; G01B 7/16; G01D 5/18; G01L 1/16
See application file for complete search history.

(56) References Cited

U.S. PATENT DOCUMENTS 4,001,798 A   1/1977   Robinson
5,298,602 A   3/1994   Shikinami
(Continued)

FOREIGN PATENT DOCUMENTS

EP   2 288 179 A1   2/2011
EP   2 290 719 A1   3/2011
(Continued)

OTHER PUBLICATIONS

PCT/JP2012/059443 Written Opinion dated May 21, 2012.

*Primary Examiner* — J. San Martin
(74) *Attorney, Agent, or Firm* — Arent Fox LLP

(57) ABSTRACT

A displacement sensor having a rectangular shaped elastic member. A piezoelectric element is attached to a first main face of the elastic member. The piezoelectric element has a rectangular-shaped piezoelectric sheet and electrodes on both main faces of the piezoelectric sheet. The piezoelectric sheet is made of poly-L-lactic acid and is at least uniaxially-stretched. The piezoelectric element is attached so that the uniaxial-stretching direction of the piezoelectric sheet is 45° relative to a long-side direction of the elastic member. When the elastic member is bent along the long-side direction, the piezoelectric sheet is stretched along the long-side direction, and the piezoelectric element generates voltage of predetermined level.

14 Claims, 20 Drawing Sheets

Related U.S. Application Data continuation of application No. PCT/JP2012/059443, filed on Apr. 6, 2012.

(51) Int. Cl.
 *G01B 7/16* (2006.01)
 *G01D 5/18* (2006.01)
 *G01L 1/16* (2006.01)

(52) U.S. Cl.
 CPC ........ *H01L 41/1134* (2013.01); *H01L 41/193* (2013.01)

(56) References Cited

U.S. PATENT DOCUMENTS

| | | |
|---|---|---|
| 6,018,210 A | 1/2000 | Date et al. |
| 6,339,956 B1 | 1/2002 | Huinink et al. |
| 2002/0062694 A1 | 5/2002 | Ehrfeld et al. |
| 2004/0174287 A1 | 9/2004 | Deak |
| 2007/0188004 A1 | 8/2007 | Browne et al. |
| 2010/0112924 A1 | 5/2010 | Alexander et al. |
| 2010/0214249 A1 | 8/2010 | Ikeda et al. |
| 2010/0245232 A1 | 9/2010 | Birnbaum et al. |
| 2011/0109204 A1 | 5/2011 | Tajitsu et al. |
| 2011/0128245 A1 | 6/2011 | Andoh et al. |
| 2012/0075226 A1 | 3/2012 | Andoh |
| 2012/0132846 A1 | 5/2012 | Yoshida |
| 2013/0057499 A1 | 3/2013 | Ando |
| 2013/0108061 A1 | 5/2013 | Ando |
| 2013/0328817 A1 | 12/2013 | Andoh |
| 2014/0152618 A1* | 6/2014 | Ando ............... G06F 3/044 345/174 |
| 2014/0292699 A1* | 10/2014 | Ando ............... G06F 3/0414 345/173 |
| 2015/0035411 A1* | 2/2015 | Kawamura ....... G01L 1/16 310/330 |
| 2015/0135857 A1* | 5/2015 | Kawamura ....... G01L 1/22 73/862.045 |
| 2016/0005951 A1* | 1/2016 | Yoshida ........... H01L 41/083 310/354 |
| 2016/0173991 A1 | 6/2016 | Mima |
| 2016/0195994 A1* | 7/2016 | Kitada ............. G06F 3/044 345/174 |
| 2016/0320899 A1* | 11/2016 | Watazu ............ G06F 3/047 |
| 2017/0131806 A1* | 5/2017 | Ando ............... G06F 3/0414 |
| 2017/0262113 A1* | 9/2017 | Mori ............... G01L 1/16 |
| 2018/0356912 A1* | 12/2018 | Yamaguchi ...... G01L 1/16 |
| 2019/0050080 A1* | 2/2019 | Bagheri ........... G06F 3/0414 |
| 2019/0088850 A1* | 3/2019 | Tanimoto ......... B32B 7/02 |

FOREIGN PATENT DOCUMENTS

| | | |
|---|---|---|
| EP | 2408034 A1 | 1/2012 |
| JP | 07-0174646 | 7/1995 |
| JP | 2000-041960 A | 2/2000 |
| JP | 2004046792 A | 2/2004 |
| JP | 2006-038710 A | 2/2006 |
| JP | 2006-230876 A | 9/2006 |
| JP | 2006-340944 A | 12/2006 |
| JP | 2007-233626 A | 9/2007 |
| JP | 2008-203911 A | 9/2008 |
| JP | 4-166702 B2 | 10/2008 |
| JP | 2010-108490 A | 5/2010 |
| JP | 2010-191892 A | 9/2010 |
| JP | 2010-225155 A | 10/2010 |
| JP | 2010-272143 A | 12/2010 |
| JP | 2011-048855 A | 3/2011 |
| WO | WO 02/35461 A1 | 5/2002 |
| WO | WO 2009/010081 A1 | 1/2009 |
| WO | WO 2009-139237 A1 | 11/2009 |
| WO | WO 2009/144964 A1 | 12/2009 |
| WO | WO 2010/104196 A1 | 9/2010 |
| WO | WO 2010/143528 A1 | 12/2010 |
| WO | WO 2011/125408 A1 | 10/2011 |

* cited by examiner

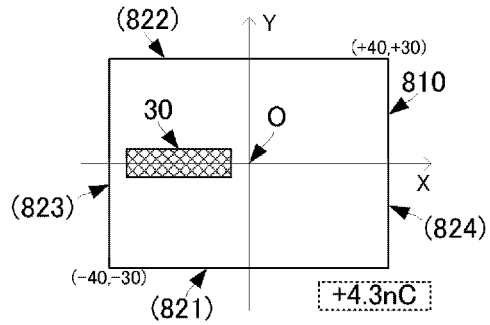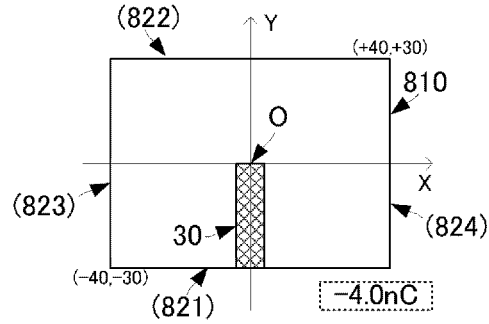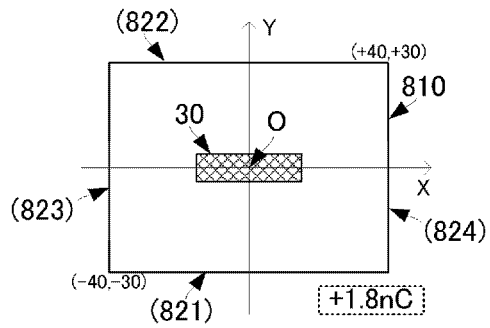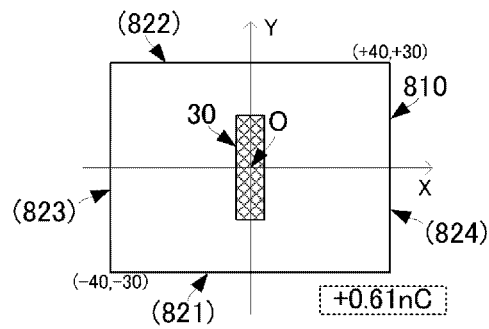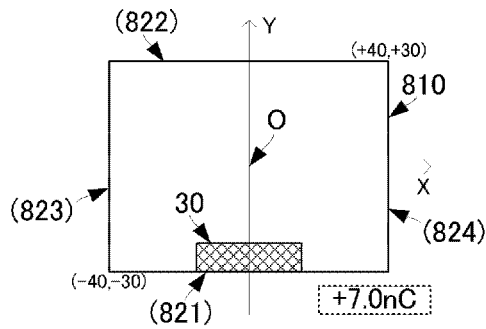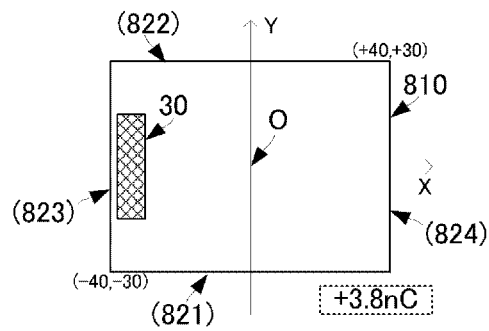

DISPLACEMENT SENSOR, DISPLACEMENT DETECTING DEVICE, AND OPERATION DEVICE

CROSS REFERENCE TO RELATED APPLICATIONS

The present application is a continuation of application Ser. No. 14/032,238, filed Sep. 20, 2013, which is a continuation of International application No. PCT/JP2012/059443, filed Apr. 6, 2012, which claims priority to Japanese Patent Application Nos. 2011-086412, filed Apr. 8, 2011, 2011-101407, filed Apr. 28, 2011, and 2011-106990, filed May 12, 2011, the entire contents of each of which are incorporated herein by reference.

FIELD OF THE INVENTION

The present invention relates to a displacement sensor attached to a subject and detecting a bending and a twist in the subject, and a displacement detecting device and an operation device each using the displacement sensor.

BACKGROUND OF THE INVENTION

Various displacement sensors for detecting a bending amount or the like of a subject by using a sheet-shaped member having piezoelectricity are devised. For example, Patent Literature 1 describes a sensor for detecting movement of a columnar projection which moves in the vertical directions by pulsation, using polyvinylidene fluoride (hereinbelow, called PVDF).

Patent Literature 1: Japanese Unexamined Patent Application Publication No. 2000-41960

SUMMARY OF THE INVENTION

However, as described also in the Patent Literature 1, in the displacement sensor using PVDF, since PVDF has pyroelectricity, a structure in which temperature change does not occur in PVDF at the time of measurement has to be built, so that the configuration of the displacement sensor is complicated. Although PVDF reacts susceptibly to a displacement in the molecular orientation direction, it hardly reacts to a displacement in the direction perpendicular to the orientation direction. There is consequently a problem such that, for example, a twist in which a displacement in the positive direction and a displacement in the negative direction exist cannot be detected by a single film.

Therefore, an object of the present invention is to provide a displacement sensor, a displacement detecting device, and an operation device with a simple structure capable of effectively, accurately, and reliably detecting a displacement in a direction in which a bending, a twist, or the like is desired to be detected without depending on measurement temperature.

A displacement sensor of the present invention includes: an elastic member; and a flat-film-shaped piezoelectric element attached to a first main face of the elastic member and obtained by forming electrodes on both main faces of a piezoelectric sheet. In the displacement sensor, preferably, the piezoelectric sheet contains polylactic acid and is stretched at least in a uniaxial direction.

In the configuration, the piezoelectric sheet is displaced by a displacement in the elastic member and, by the piezoelectric effect, an output voltage according to the displacement amount is output from the electrodes formed on both faces of the piezoelectric sheet. By the voltage, the displacement in the elastic member can be detected.

The piezoelectric sheet containing polylactic acid has a characteristic that when the sheet is stretched at least in a uniaxial direction, piezoelectricity in a specific direction becomes very large. Therefore, by disposing the piezoelectric sheet containing polylactic acid on the elastic member so that the uniaxial stretch direction is along a predetermined direction, various displacements can be individually and effectively detected in accordance with the orientation of the uniaxial stretch direction.

Consequently, when the angle formed between the uniaxial stretch direction and a direction (predetermined direction) of a displacement desired to be detected is properly set, displacements (for example, a bending, a twist, or the like which will be described later) in the predetermined direction of the elastic member can be individually and effectively detected. That is, different from PVDF, polylactic acid has the piezoelectricity $d_{14}$, not $d_{31}$, so that a displacement in the piezoelectric sheet can be simply detected and, in addition, displacements in the predetermined direction can be individually and effectively detected. Since the piezoelectric sheet is made of polylactic acid, pyroelectricity which occurs in PVDF does not occur, and the voltage which is output according to the displacement amount is not influenced by a temperature change.

In the displacement sensor of the invention, as an example, the piezoelectric sheet is a flat film whose main face has an almost rectangular shape, and can be formed so that a stretch axis of the uniaxial direction is oriented along at least a direction of about 45° or a direction of about −45° with respect to a long-side direction of the flat film.

With the configuration, the direction in which the piezoelectricity of the piezoelectric sheet is the highest can be matched with the direction of a bending (displacement detection direction) along the long-side direction. Consequently, a bending state can be detected, and the long-side direction in which a bending occurs most becomes the displacement detection direction, so that a higher-sensitivity displacement sensor can be realized.

In the displacement sensor of the invention, as an example, the piezoelectric sheet is a flat film whose main face has an almost rectangular shape, and can be formed so that a stretch axis of the uniaxial direction is oriented along at least a direction of about zero degree or a direction of about 90° with respect to a long-side direction of the flat film.

In the configuration, the direction in which the piezoelectricity of the piezoelectric sheet is the highest can be matched with the direction of a twist (displacement detection direction) along the long-side and short-side directions. Consequently, a high-sensitivity displacement sensor for detecting a twisted state can be realized.

In the displacement sensor of the invention, as an example, the piezoelectric sheet is a flat film whose main face has an almost rectangular shape, and can be formed so that a stretch axis of the uniaxial direction is oriented along at least a direction of about 22.5° or a direction of about 67.5° with respect to a long-side direction of the flat film.

In the configuration, a bending along the long-side direction and a twist in the long-side and short-side directions can be simultaneously and effectively detected.

Preferably, the displacement sensor of the invention has the following configuration. The flat-film-shaped piezoelectric element attached to the first main face of the elastic member is set as a first flat-film-shaped piezoelectric element. A second flat-film-shaped piezoelectric element attached to a second main face opposed to the first main face of the elastic member, and obtained by forming electrodes on both main faces of a piezoelectric sheet is further provided. The piezoelectric sheet of the second flat-film-shaped piezoelectric sheet contains polylactic acid and is formed so as to be stretched at least in a uniaxial direction.

In the configuration, the flat-film-shaped piezoelectric elements are attached to both main faces of the elastic member. By making the polarities of output voltages of the elements match and simply adding the voltages, the output voltage can be doubled. Further, the polarities of output voltages are made match and an average value process can be performed. Thus, higher-precision displacement detection can be realized.

In the displacement sensor of the invention, preferably, the piezoelectric sheet of the first flat-film-shaped piezoelectric element is a flat film whose main face has an almost rectangular shape, and is formed so that a stretch axis of the uniaxial stretch is oriented along at least a direction of about 45° or a direction of about −45° with respect to a long-side direction of the flat film. The piezoelectric sheet of the second flat-film-shaped piezoelectric element is a flat film whose main face has an almost rectangular shape, and is formed so that a stretch axis of the uniaxial direction is oriented along at least a direction of about zero degree or a direction of about 90° with respect to a long-side direction of the flat film.

In the configuration, a bending along the long-side direction can be detected by the first flat-film-shaped piezoelectric element, and a twist in the long-side and short-side directions can be detected by the second flat-film-shaped piezoelectric element. That is, a bending and a twist can be simultaneously and individually detected by a single displacement sensor.

In the displacement sensor of the invention, preferably, the piezoelectric sheet of the first flat-film-shaped piezoelectric element is a flat film whose main face has an almost rectangular shape, and is formed so that a stretch axis of the uniaxial direction is oriented along at least a direction of about 22.5° or a direction of about 67.5° with respect to a long-side direction of the flat film, and the piezoelectric sheet of the second flat-film-shaped piezoelectric element is a flat film whose main face has an almost rectangular shape, and is formed so that a stretch axis of the uniaxial direction is oriented along at least a direction of about 22.5° or a direction of about 67.5° with respect to a long-side direction of the flat film.

In the configuration, the presence/absence of a displacement and a twice can be detected by both faces of the elastic member. Therefore, a displacement and a twist can be detected more accurately.

Preferably, the elastic member of the displacement sensor of the invention has conductivity, and the electrode on the elastic member side of the first flat-film-shaped piezoelectric element and the electrode on the elastic member side of the second flat-film-shaped piezoelectric element are used also by the elastic member having conductivity.

In the configuration, the electrode on the elastic member side of the first flat-film-shaped piezoelectric element and the electrode on the elastic member side of the second flat-film-shaped piezoelectric element are used also by the elastic member, so that the configuration of the displacement sensor is simplified, and can be made thinner.

In the displacement sensor of the invention, a plurality of the flat-film-shaped piezoelectric elements can be stacked.

In the displacement sensor of the invention, a plurality of at least one of the piezoelectric sheet of the first flat-film-shaped piezoelectric element or the piezoelectric sheet of the second flat-film-shaped piezoelectric element can be stacked.

In those configurations, an output voltage can be obtained from each of the stacked flat-film-shaped piezoelectric elements, so that the total output voltage of the displacement sensor can be increased.

In the displacement sensor of the invention, preferably, the electrode and the elastic member are made of material having translucency.

In the configuration, since polylactic acid has high translucency, by forming the other components of material having translucency, a displacement sensor having translucency can be realized.

The displacement sensor of the invention can be also realized by the following configuration. A displacement sensor includes a flat-film-shaped piezoelectric element attached to a circumferential face of a columnar shaft as a member to be detected and obtained by forming electrodes on both main faces of a piezoelectric sheet. It is preferable that the piezoelectric sheet contains polylactic acid and is formed so that a stretch axis is oriented in either a direction of about zero degree or in a direction of about 90° with respect to a circumferential direction.

In the configuration, a thin-type displacement sensor capable of detecting a twist in a shaft can be realized.

The displacement sensor of the invention can be also realized by the following configuration. A displacement sensor includes first and second flat-film-shaped piezoelectric elements each obtained by forming electrodes on both main faces of a piezoelectric sheet. The first and the second flat-film-shaped piezoelectric elements have the same strength. The first and second flat-film-shaped piezoelectric elements are in contact with each other so that their flat plate faces are opposed to each other. Preferably, the piezoelectric sheet contains polylactic acid and is stretched at least in a uniaxial direction.

Also with such a configuration, a displacement in one direction and a displacement in two directions can be detected as described above. Further, it is unnecessary to use an elastic member, so that the configuration of the displacement sensor can be simplified.

According to the present invention, a displacement detecting device can be realized by using the displacement sensor. The displacement detecting device includes: any of the above-described displacement sensors; voltage measuring means which detects generation voltage in the displacement sensor; and a capacitor connected in parallel to the displacement sensor.

In the configuration, although it is difficult to maintain the output voltage level by the displacement almost constant with only the displacement sensor, by connecting the capacitor in parallel to the displacement sensor, the output voltage level can be maintained almost constant while the member to be detected displaces. It facilitates detection of the output voltage level and, further, detection of a displacement amount.

The displacement sensor of the invention can be used for the following operation device. The operation device includes: a casing which is subject to external force; a displacement sensor which detects displacements in a bending direction and a twist direction individually when the casing is deformed by external force; and an application executing unit which executes a predetermined application by using a detection voltage of the displacement sensor according to the external force.

In the configuration, by using the detection voltage of the displacement sensor, a predetermined application can be executed. The casing can be used also an elastic member.

Particularly, when displacements in the bending direction and the twist direction can be detected individually, an application according to the detection voltage in the bending direction and an application according to the detection voltage in the twist direction can be separately executed.

In the operation device of the invention, preferably, the application executing unit includes: a communication control unit which transmits the detection voltage by radio; and a program executing unit which receives a radio signal from the communication control unit and uses the detection voltage for a program execution status of the application.

In the case of realizing the configuration as a separate member, it is unnecessary to integrate the displacement detection part and the application executing unit. Consequently, even when the application executing unit becomes bigger, the displacement detection part can be made smaller and thinner. Therefore, for example, even when the displacement detecting function is provided in a product worn by the user (such as shoes) and a product which is held and operated by a hand (such as a controller, a remote controller, or the like), the size of those products is not increased.

In the operation device of the invention, preferably, the displacement sensor has a flat-film-shaped piezoelectric element obtained by forming electrodes on both main faces of a piezoelectric sheet, and outputs a detection voltage of the flat-film-shaped piezoelectric element according to a displacement.

In the configuration, a concrete structure of the displacement sensor used for the operation device is shown. By using the structure, the displacement sensor can be made thinner. Thus, the operation devices such as a controller and a remote controller can be configured thinly.

In the operation device of the invention, preferably, the piezoelectric sheet contains polylactic acid and is stretched at least in a uniaxial direction.

In the configuration, since the piezoelectric sheet contains polylactic acid, the detection voltage according to the displacement can be made high, and a change in the detection voltage value according to temperature can be also suppressed.

In the operation device of the invention, preferably, a photovoltaic element is disposed in the casing.

In the configuration, even when a general chemical-reaction-type battery such as a nickel battery is not provided, a control signal for the operation device according to the detection voltage can be output.

In the operation device of the invention, preferably, the flat-plate-shaped elastic member has a double-layer structure, and a photovoltaic element having a flat plate shape is disposed between an elastic member of an upper layer and an elastic member of a lower layer. The elastic member on a wave-receiving-face side of the photovoltaic element and the flat-film-shaped piezoelectric element can have translucency.

In the configuration, while having the photovoltaic element, reduction in thickness and size can be realized. Since the photovoltaic element serves as the displacement neutral layer, high-precision displacement detection can be realized in a state where the stress of extension/contraction related to the photovoltaic element is minimized.

Preferably, the operation device of the invention further includes a secondary battery for charging electromotive force generated by the photovoltaic element.

In the configuration, the electromotive force of the photovoltaic element can be charged. Consequently, even in the case where the electromotive force of the photovoltaic element is low and a situation that no electromotive force can be generated, a control signal for the operation device according to the detection voltage can be output.

In the operation device of the invention, preferably, the photovoltaic element has a charging function part which is connected to an output terminal of the flat-film-shaped piezoelectric element and charges the secondary battery by using the detection voltage of the flat-film-shaped piezoelectric element.

In the configuration, while the flat-film-shaped piezoelectric element uses the detection voltage for generation of a control signal for the operation device, the secondary battery can be charged by the detection voltage.

Preferably, the operation device of the invention has the following configuration. The operation device includes a flat-film-shaped piezoelectric element and a casing. The flat-film-shaped piezoelectric element has a piezoelectric sheet containing polylactic acid and stretched at least in a uniaxial direction, and electrodes formed on both main faces of the piezoelectric sheet. The casing has faces extended in two directions which are almost orthogonal to each other in plan view. A region in which the electrodes of the flat-film-shaped piezoelectric element are opposed to each other is disposed in a position where the difference of distortions in the two directions which are almost orthogonal to each other is large when the planes extended in the two directions which are almost orthogonal to each other in the casing are deformed.

In the configuration, for the deformation of the planes extended in the two directions which are almost orthogonal to each other in the casing, the flat-film-shaped piezoelectric element generates charges efficiently. Thus, the output voltage sensitivity to deformation in the casing can be improved.

In the operation device of the invention, the piezoelectric sheet may be disposed only in the region in which the electrodes of the flat-film-shaped piezoelectric element are opposed.

In the operation device of the invention, the electrodes of the flat-film-shaped piezoelectric element may be formed in regions except for the center of planes extending in the two directions which are almost orthogonal to each other in the casing.

In the configurations, examples of disposing the flat-film-shaped piezoelectric element in the casing are described.

In the operation device of the invention, preferably, the electrodes are formed in a region in which polarities of charge distributions generated by distortion of the casing are the same.

In the configuration, cancellation of charges in the electrodes does not occur, so that the charges caused by a deformation can be generated more efficiently. As a result, the output voltage sensitivity to a deformation can be further improved.

In the operation device of the invention, the electrode is made of a plurality of partial electrodes, and the plurality of partial electrodes may be connected so that polarities of voltages generated match and are added.

In the configuration, the voltages generated by the plurality of partial electrodes can be added without being cancelled out. Therefore, the output voltage sensitivity to a deformation can be further improved.

Further, an operation device of the invention may have the following configuration. The operation device includes a flat-film-shaped piezoelectric element and a touch panel part. The flat-film-shaped piezoelectric element has a piezoelectric sheet containing polylactic acid and stretched at least in a uniaxial direction, and press force detecting electrodes formed on both main faces of the piezoelectric sheet. The touch panel part is stacked so as to be parallel to the flat-film-shaped piezoelectric element.

In the configuration, a press position can be detected by the touch panel part and a press force can be detected by the flat-film-shaped piezoelectric element. Therefore, control according to the press position and the press force can be performed.

According to the present invention, with the simple and thin structure, a displacement desired to be detected such as a bending or a twist can be efficiently, accurately, and reliably detected without depending on measurement temperature.

BRIEF EXPLANATION OF THE DRAWINGS

FIGS. 24A to 24F are diagrams illustrating examples of disposition of the piezoelectric element 30 in the casing 810.

DETAILED DESCRIPTION OF THE INVENTION

Figure 1:
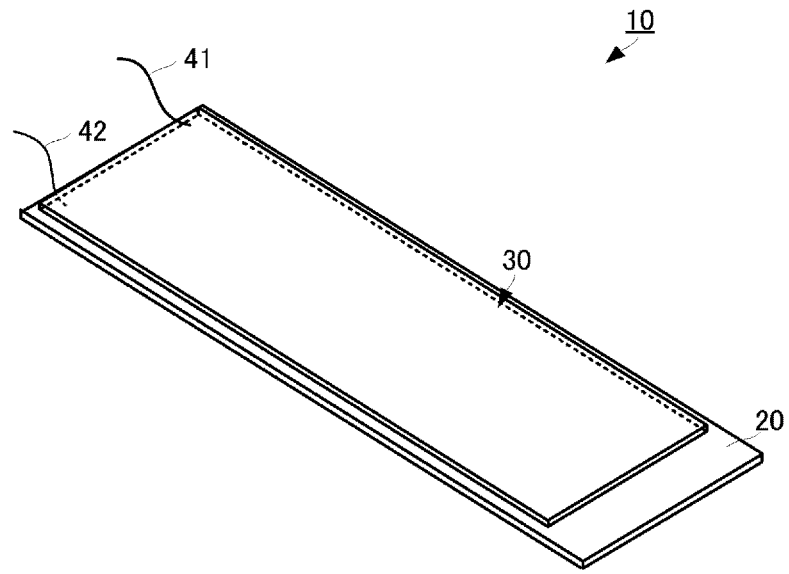
FIG. 1 is an appearance perspective view of a displacement sensor 10 according to a first embodiment.
Figure 2A:
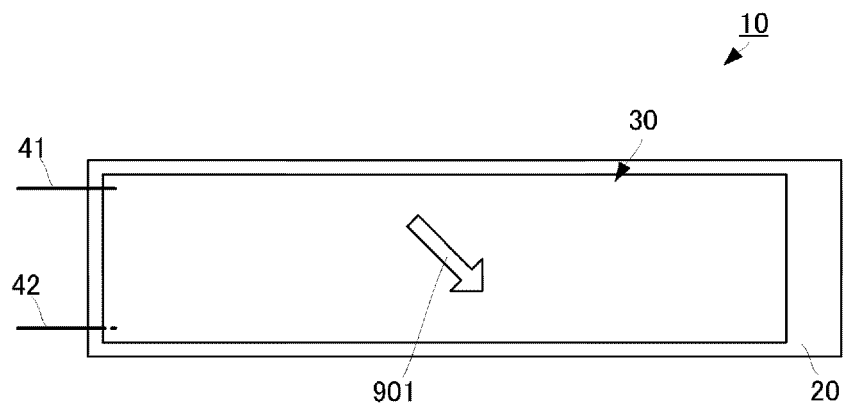
FIGS. 2A and 2B are a plan view and a side view, respectively, of the displacement sensor 10.
Figure 2B:
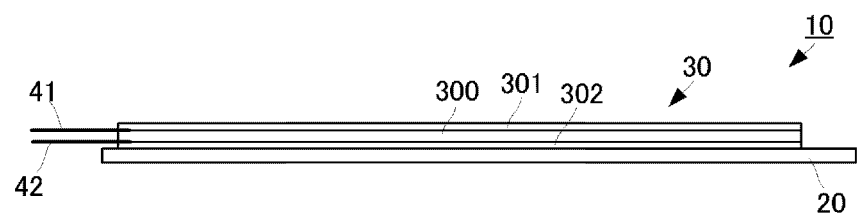

A displacement sensor according to a first embodiment of the present invention will be described with reference to the drawings. FIG. 1 is an appearance perspective view of a displacement sensor 10 of the embodiment. FIGS. 2A and 2B are a plan view and a side view, respectively, of the displacement sensor 10. FIG. 2B is a side view in which the long-side direction of the displacement sensor 10 corresponds to the lateral direction of the diagram (an end face of the short-side direction is viewed).

The displacement sensor 10 has an elastic member 20 having a flat plate shape and a piezoelectric element 30 in a flat film shape. The elastic member 20 has predetermined thickness and, in plan view, a rectangular shape having long and short directions, which is long in one direction and short in a direction perpendicular to the direction. The elastic member 20 is made of polymer having relatively high strength such as polyethylene terephthalate (PET) or acrylic resin (PMMA). In this case, preferably, the thickness of the elastic member 20 is, for example, about 0.5 mm to 2 mm. It is sufficient that the mechanical strength of the elastic member 20 is higher than at least that of a piezoelectric sheet 300 as a component of the piezoelectric element 30.

The piezoelectric element 30 has the piezoelectric sheet 300 having a rectangular shape similar to that of the elastic member 20. The piezoelectric sheet 300 is made of poly-L-lactic acid (hereinbelow, called PLLA). The piezoelectric sheet 300 may be made of poly-D-lactic acid (hereinbelow, called PDLA).

An electrode 301 is formed on an almost entire first main face of the piezoelectric sheet 300. An electrode 302 is formed on an almost entire second main face of the piezoelectric sheet 300. As the electrodes 301 and 302, preferably, any of an organic electrode whose main components are ITO, ZnO, and polythiophene or an organic electrode whose main component is polyaniline is used. By using those materials, the electrodes 301 and 302 have high translucency. Consequently, the displacement sensor having high translucency can be realized.

It is more preferable to use any of an organic electrode whose main component is polythiophene or an organic electrode whose main component is polyaniline as the electrodes 301 and 302 for the reason that the electrode has translucency and, in addition, breakage of the electrode caused by bending hardly occurs. In the case where translucency is unnecessary, the electrodes 301 and 302 may be formed by a metal coating formed by vapor deposition or plating or a printed electrode film made by a silver paste. In particular, an aluminum vapor-deposited film is suitable since it can be formed at low cost.

An external connection terminal 41 is connected to the electrode 301, and an external connection terminal 42 is connected to the electrode 302.

PLLA used for the piezoelectric sheet 300 of the displacement sensor 10 having such a configuration is chiral polymer and the main chain has a helical structure. The PLLA sheet is uniaxially-stretched. When molecules are oriented, the PLLA sheet has piezoelectricity. The piezoelectric constant of the uniaxially-stretched PLLA is very high in the category of high polymers.

The multiple number of stretch is suitably about three to eight times. By performing heat treatment after the stretch, crystallization of stretched-chain crystal of polylactic acid is accelerated, and the piezoelectric constant improves. In the case of performing biaxial stretching, by making the multiple numbers of stretch of the axes different from each other, an effect similar to that in the case of uniaxial stretching can be obtained. For example, in the case of performing stretching of eight times in a direction which is set as an X axis and performing stretching of twice in a Y-axis direction orthogonal to the X axis, with respect to the piezoelectric constant, an effect equivalent to the case of performing uniaxial stretching of four times in the X-axis direction is obtained. Since a uniaxially-stretched film is simply easily split in the stretch axis direction, by performing biaxial stretching as described above, the strength can be increased to some extent.

PLLA comes to have piezoelectricity only by the stretch, and does not need poling process unlike other polymers such as PVDF or piezoelectric ceramics. That is, the piezoelectricity of PLLA which does not belong to ferroelectrics is not brought about by polarization of ions unlike ferroelectrics such as PVDF and PZT but is derived from the spiral structure as the characteristic structure of molecules. Consequently, pyroelectricity which occurs in other ferroelectric piezoelectric elements does not occur in PLLA. Further, in PVDF and the like, fluctuations occur with time in the piezoelectric constant and, in some cases, the piezoelectric constant decreases remarkably. However, the piezoelectric constant of PLLA is extremely stable with time.

As described above, when PLLA is used, it is not influenced by pyroelectricity. Therefore, at the time of detection, without depending on the temperature in a detection position, output voltage according only to the displacement amount can be obtained. Since PLLA is a polymer and has flexibility, it is not damaged by a large displacement unlike piezoelectric ceramics. Therefore, even when a displacement amount is large, the displacement amount can be detected with reliability.

The relative permittivity of PLLA is about 2.5 and very low. When d is set as a piezoelectric constant and $\varepsilon_T$ is set as dielectric constant, a piezoelectric output constant (=piezoelectric "g" constant, $g=d/\varepsilon^T$) becomes a large value.

The piezoelectric "g" constant of PVDF having dielectric constant $\varepsilon_{33}{}^T=13\times\varepsilon_0$ and piezoelectric constant $d_{31}=25$ pC/N is $g_{31}=0.2172$ Vm/N from the above-described equation. On the other hand, when the piezoelectric "g" constant of PLLA having piezoelectric constant $d_{14}=10$ pC/N is converted to $g_{31}$, since $d_{14}=2\times d_{31}$, $d_{31}=5$ pC/N, and the piezoelectric "g" constant becomes $g_{31}=0.2258$ Vm/N. Therefore, by PLLA having the piezoelectric constant $d_{14}=10$ pC/N, sufficient sensor sensitivity equivalent to that of PVDF can be obtained. The inventors of the present invention obtained PLLA of $d_{14}=15$ to 20 pC/N experimentally. By using the PLLA sheet, a sensor having very high sensitivity is realized.

Figure 3:
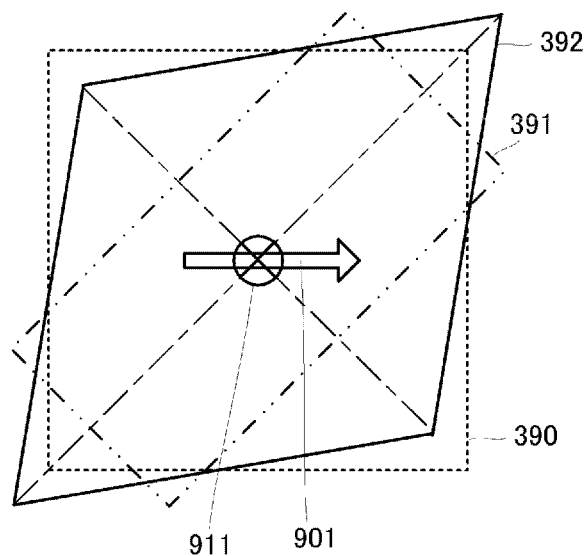
FIG. 3 is a diagram illustrating the relations among an applied electric field direction, a stretch direction, and a stretch state of a piezoelectric sheet using PLLA.

Further, since the piezoelectricity of PLLA has anisotropy, a sheet is cutout from a uniaxially-stretched original sheet as will be described below. FIG. 3 is a diagram illustrating the relations among an applied electric field direction, a stretch direction, and a stretch state of a piezoelectric sheet using PLLA. To facilitate explanation, in this case, a case where a piezoelectric sheet 390 before application of electric field has a square shape is illustrated.

The piezoelectric sheet having a square shape illustrated by a broken line 390 in FIG. 3 is uniaxially stretched in a direction indicated by an arrow symbol 901 in FIG. 3 (lateral direction in FIG. 3). When an electric field in a direction indicated by an electric field symbol 911 in FIG. 3 (a direction to the depth in the drawing from this side of FIG. 3) is applied to the piezoelectric sheet 390, by the effect of $d_{14}$, the sheet is deformed to a parallelogram indicated by a solid line 392. At this time, the direction in which the piezoelectric sheet is stretched the most is a direction turned by 45° from the uniaxial stretch direction in a counterclockwise fashion, and the direction in which the piezoelectric sheet becomes the shortest is a direction turned by −45° from the uniaxial stretch direction in a counterclockwise fashion.

Therefore, as illustrated by an alternate long and two short dashes line 391 in FIG. 3, a piezoelectric sheet is cut out using, as the long-side direction, the 45° direction from the uniaxial stretch direction. In such a manner, the above-described piezoelectric sheet 300 can be formed in a state where sensitivity is highest to stretch.

The piezoelectric sheet 300 of the embodiment is formed so that the uniaxial stretch direction forms an angle of 45° from the long-side direction. The piezoelectric element 30 obtained by forming the electrodes 301 and 302 on both faces of the piezoelectric sheet 300 having such a shape as described above is attached to the first main face of the elastic member 20 by a not-illustrated translucent adhesive.

The angle is not limited to exactly 45° but may be about 45°. The angle of "about 45°" refers to an angle, for example, in a range of about ±10° of 45°. The angles are design matters to be properly determined according to a general design including bending sensing precision on the basis of the use of the displacement sensor.

Figure 4A:
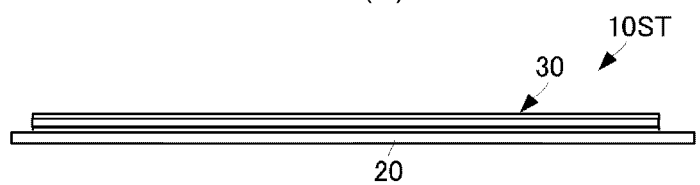
FIG. 4A is a diagram illustrating an almost side face shape of the displacement sensor 10 in a state where a bending displacement is zero.
Figure 4B:
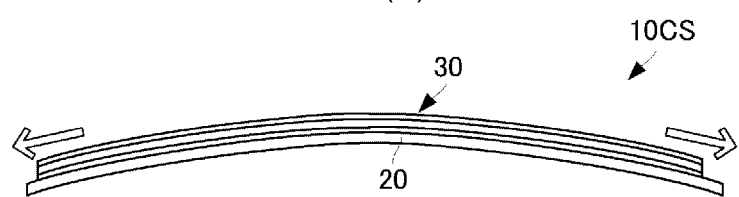
FIG. 4B is a diagram illustrating an almost side face shape of the displacement sensor 10 in a state where a predetermined bending displacement occurs.

The displacement sensor 10 having such a shape can detect a bending along the long-side direction of 45° from the uniaxial stretch direction as illustrated in FIG. 4B. FIG. 4A is a diagram illustrating an almost side face shape of the displacement sensor in a state where a bending displacement is zero, and FIG. 4B is a diagram illustrating an almost side face shape of the displacement sensor 10 in a state where a predetermined bending displacement occurs.

In the case where the bending displacement is zero, that is, in the case where a force of causing bending is not applied from the outside to the displacement sensor 10, the elastic member 20 is in a state where its main face is flat as illustrated by a symbol 10ST in FIG. 4A. In this case, the piezoelectric element 30 is not stretched, and no voltage is generated.

In the case where the bending displacement has a predetermined value, that is, in the case where a force of causing bending is applied from the outside to the displacement sensor 10, the elastic member 20 is in a state where it is curved along the long-side direction of the main face as illustrated by a symbol 10CS in FIG. 4B. In this case, the piezoelectric element 30 is stretched along the long-side direction in accordance with a bending amount. As a result, a voltage according to the stretch amount is generated between the electrodes 301 and 302 of the piezoelectric element 30. By detecting the voltage, the stretch in the piezoelectric element 30, that is, the bending amount of the displacement sensor 10 can be detected.

Figure 5:
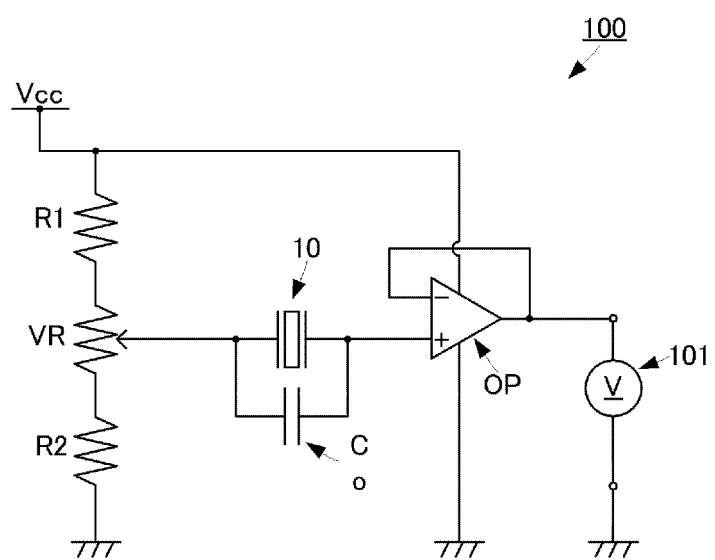
FIG. 5 is an equivalent circuit diagram of a displacement detecting device 100 including the displacement sensor 10.
Figure 6A:
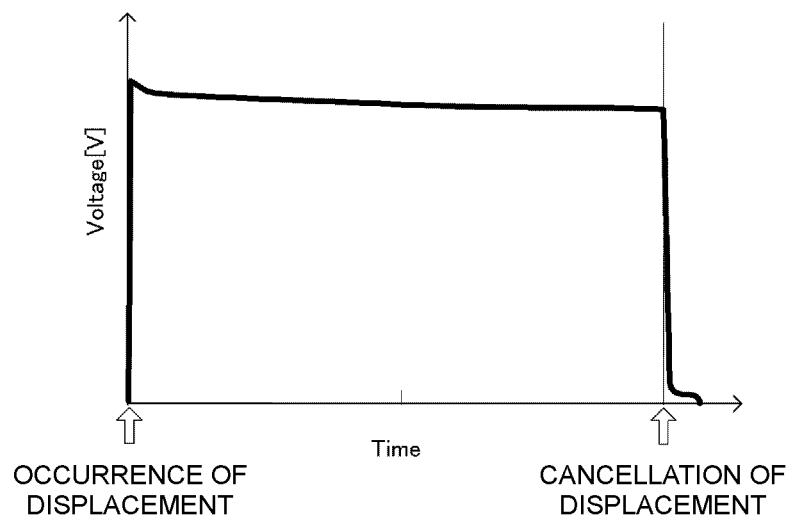
FIGS. 6A and 6B illustrate output characteristics of the displacement detecting device 100.
Figure 6B:
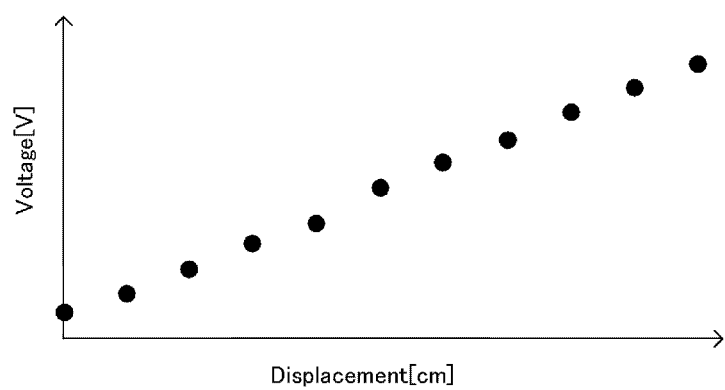

As described above, by using the configuration of the embodiment, the bending amount can be detected. Further, a circuit as illustrated in FIG. 5 may be configured. FIG. 5 is an equivalent circuit diagram of a displacement detecting device 100 including the displacement sensor 10. FIGS. 6A and 6B illustrate output characteristics of the displacement detecting device 100. FIG. 6A illustrates an output voltage change from occurrence of a displacement until cancellation of the displacement, and FIG. 6B illustrates a displacement-voltage characteristic.

As illustrated in FIG. 5, one of the external connection terminals of the displacement sensor 10 is connected to a variable control terminal of a variable resistor VR. The variable resistor VR is connected between constant resistors R1 and R2, a drive voltage Vcc is applied to an end on the constant resistor R1 side of a series circuit of the constant resistors R1 and R2 and the variable resistor VR, and an end on the constant resistor R2 side is connected to the ground.

The other external connection terminal of the displacement sensor 10 is connected to a non-inversion input terminal of an operational amplifier OP. A DC voltage detector 101 is connected to the output terminal of the operational amplifier OP. The output terminal of the operational amplifier OP is feed-back connected to the inversion input terminal of the operational amplifier OP. Also to the operational amplifier OP, the drive voltage Vcc is supplied.

Further, to the displacement sensor 10, a capacitor Co is connected in parallel. In this case, as the capacitor Co having capacity of, for example, about 0.2 μF is used.

By using the displacement detecting device 100 having such a configuration, the output voltage of the displacement sensor 10 can be almost maintained while displacement occurs as illustrated in FIG. 6A. In the displacement sensor 10 itself, voltage is generated at the timing the displacement occurs, and the output voltage value decreases rapidly due to unintended leak current or the like. However, by connecting the capacitor Co in parallel to the displacement sensor 10, the time constant of the voltage drop can be made longer. As a result, the output voltage can be detected more reliably.

By using the configuration of the embodiment, as illustrated in FIG. 6B, the output voltage value changes almost linearly relative to the displacement amount. Therefore, the displacement amount can be detected accurately.

Since the input impedance of the operational amplifier OP is very large, the time constant at the time of voltage drop can be made long without using the capacitor Co. Therefore, the capacitor Co may not be used.

As described above, by using the displacement sensor 10 and the displacement detecting device 100 of the embodiment, the bending amount along a predetermined direction (in the embodiment, the long-side direction) can be detected with high accuracy and high sensitivity. Further, since the piezoelectricity of PLLA has anisotropy, in the configuration of the embodiment, only the bending (stretch) in the long-side direction is detected. Consequently, without being influenced by bending or twist in a direction different from the long-side direction as a detection direction, only bending in the long-side direction as the detection direction can be detected accurately.

Figure 7A:
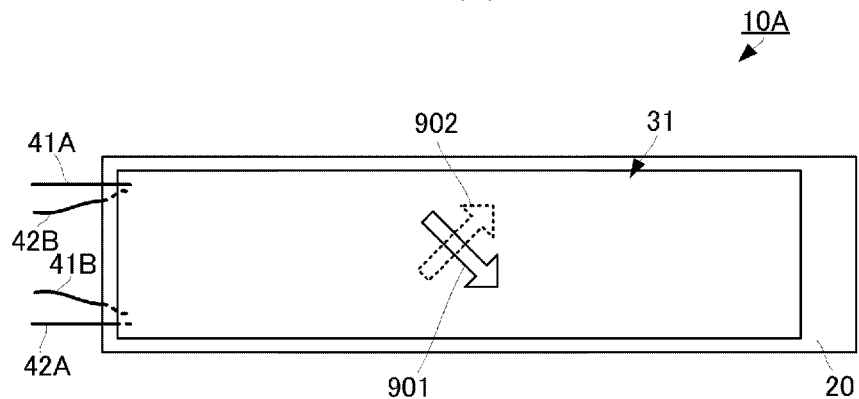
FIGS. 7A, 7B, and 7C are a plan view, a side view, and a rear view, respectively, of a displacement sensor 10A according to a second embodiment.
Figure 7B:
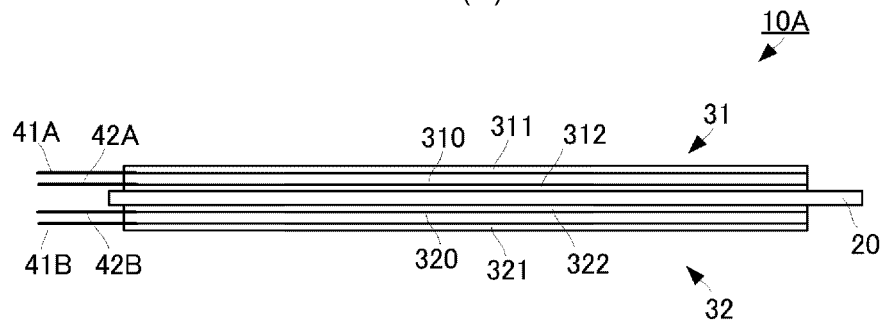
Figure 7C:
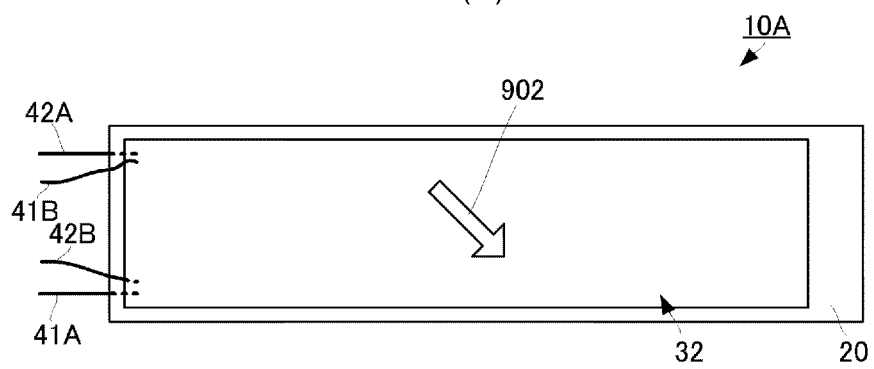

Next, a displacement sensor according to a second embodiment will be described with reference to the drawings. FIGS. 7A, 7B, and 7C are a plan view, a side view, and a rear view, respectively, of a displacement sensor 10A according to the second embodiment.

The displacement sensor 10A of the embodiment has the elastic member 20, a first piezoelectric element 31 corresponding to a first flat-film-shaped piezoelectric element of the present invention, and a second piezoelectric element 32 corresponding to a second flat-film-shaped piezoelectric element of the invention. The elastic member 20 is the same as that of the first embodiment, and its description will not be therefore repeated.

The first piezoelectric element 31 is attached to the first main face of the elastic member 20. The first piezoelectric element 31 has a piezoelectric sheet 310 having a rectangular shape. Like the piezoelectric sheet 300 of the first embodiment, the piezoelectric sheet 310 is formed so that 45° is formed between the uniaxial stretch direction and the long-side direction. Electrodes 311 and 312 are formed almost entirely on both faces of the piezoelectric sheet 310. An external connection terminal 41A is connected to the electrode 311, and an external connection terminal 42A is connected to the electrode 312.

The second piezoelectric element 32 is attached to the second main face opposed to the first main face of the elastic member 20. The second piezoelectric element 32 has a piezoelectric sheet 320 having a rectangular shape. Like the piezoelectric sheet 310 and the piezoelectric sheet 300 of the first embodiment, the piezoelectric sheet 320 is also formed so that 45° is formed between the uniaxial stretch direction and the long-side direction. Electrodes 321 and 322 are formed almost entirely on both faces of the piezoelectric sheet 320. An external connection terminal 41B is connected to the electrode 321, and an external connection terminal 42B is connected to the electrode 322.

The first and second piezoelectric elements 31 and 32 are attached to the elastic member 20 so that the uniaxial stretch direction forms 90° when viewed from a direction orthogonal to the main face of the elastic member 20.

With such a configuration, for example, in the case where a bending occurs such that the piezoelectric sheet 310 of the first piezoelectric element 31 extends in the long-side direction, the piezoelectric sheet 320 of the second piezoelectric element 32 contracts. When the first and second piezoelectric elements 31 and 32 are formed of the same material and in the same shape, the neutral face of the bending becomes the center axis in the thickness direction of the elastic member 20. Consequently, the absolute value of the force of extending the first piezoelectric element 31 and that of the force of contracting the second piezoelectric element 32 become equal to each other. Thus, voltages having the same absolute value and opposite characteristics are generated in the first and second piezoelectric elements 31 and 32.

Therefore, by a pattern of connecting the external connection terminals or the like, by adding the output voltage of the first piezoelectric element 31 and the output voltage of the second piezoelectric element 32 while making the characteristics (positive and negative) match, an output voltage which is twice as large as that in the case of using one piezoelectric element described in the first embodiment can be obtained. By performing an average value process while making the characteristics (positive and negative) of the output voltage of the first piezoelectric element 31 and the output voltage of the second piezoelectric element 32 match, an output voltage with a small error can be obtained.

Although 90° is formed between the uniaxial stretch direction of the piezoelectric sheet 310 of the first piezoelectric element 31 and the uniaxial stretch direction of the piezoelectric sheet 320 of the second piezoelectric element 32 when seen from a direction perpendicular to the main face in the embodiment, the first and second piezoelectric elements 31 and 32 may be attached so that the directions are parallel to each other. In this case, the first and second piezoelectric elements 31 and 32 can obtain output voltages of the same characteristic.

Figure 8A:
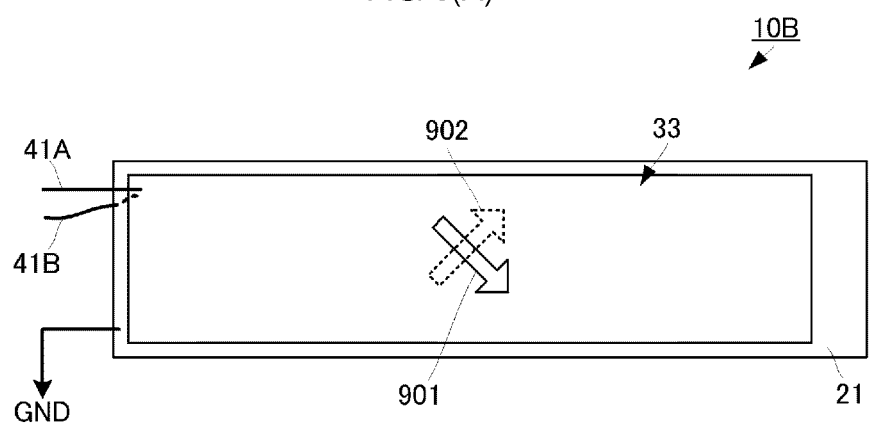
FIGS. 8A and 8B are a plan view and a side view, respectively, of a displacement sensor 10B according to a third embodiment.
Figure 8B:
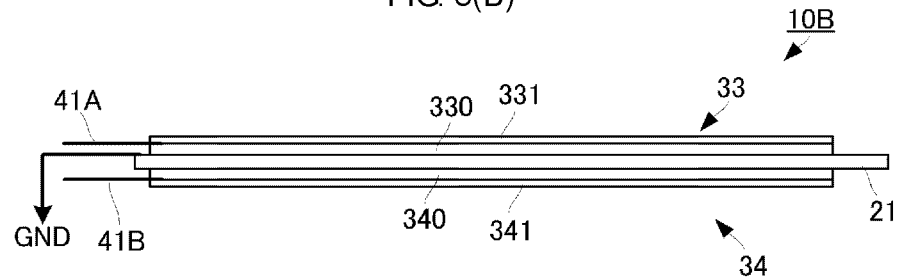

Next, a displacement sensor according to a third embodiment will be described with reference to the drawings. FIGS. 8A and 8B are a plan view and a side view, respectively, of a displacement sensor 10B of the third embodiment.

The displacement sensor 10B has an elastic member 21 having conductivity. Like the elastic member 20 described in the foregoing embodiments, the elastic member 21 has a long rectangular shape. The elastic member 21 may be formed of, for example, metal or obtained by metal-plating the surface of an insulating elastic member (PET, PMMA, or the like). The elastic member 21 is connected to the ground (is grounded).

A piezoelectric sheet 330 is attached to the first main face of the elastic member 21. The piezoelectric sheet 330 has the same material, the same shape, and the same uniaxial stretch direction as those of the piezoelectric sheet 310 of the second embodiment. An electrode 331 is formed on a surface opposed to the elastic member 21 of the piezoelectric sheet 330. The external connection terminal 41A is connected to the electrode 331. By the piezoelectric sheet 330 and the electrode 331 and the conductive elastic member 21 disposed while sandwiching the piezoelectric sheet 330, a third piezoelectric element 33 (corresponding to a first flat-film-shaped piezoelectric element of the present invention) is constructed.

A piezoelectric sheet 340 is attached to the second main face opposed to the first main face of the elastic member 21. The piezoelectric sheet 340 has the same material, the same shape, and the same uniaxial stretch direction as those of the piezoelectric sheet 320 of the second embodiment. An electrode 341 is formed on a surface opposed to the elastic member 21 of the piezoelectric sheet 340. The external connection terminal 41B is connected to the electrode 341. By the piezoelectric sheet 340 and the electrode 341 and the conductive elastic member 21 disposed while sandwiching the piezoelectric sheet 340, a fourth piezoelectric element 34 (corresponding to a second flat-film-shaped piezoelectric element of the present invention) is constructed.

Also with such a configuration, in a manner similar to the foregoing second embodiment, a displacement caused by a bending in a long-side direction can be detected. Further, with the configuration of the third embodiment, the conductive elastic member 21 also serves as the electrode of one of the two piezoelectric elements. Therefore, the configuration of the displacement sensor 10B is simplified and noise due to an external factor can be further suppressed.

Figure 9A:
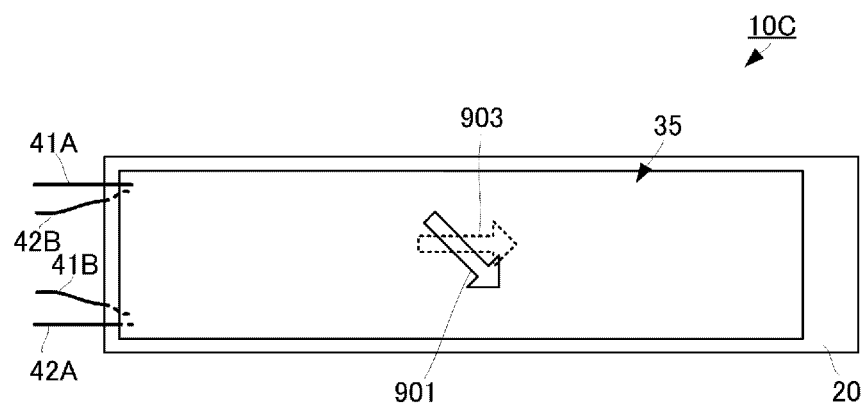
FIGS. 9A, 9B, and 9C are a plan view, a side view, and a rear view, respectively, of a displacement sensor 10C according to a fourth embodiment.
Figure 9B:
Figure 9C:
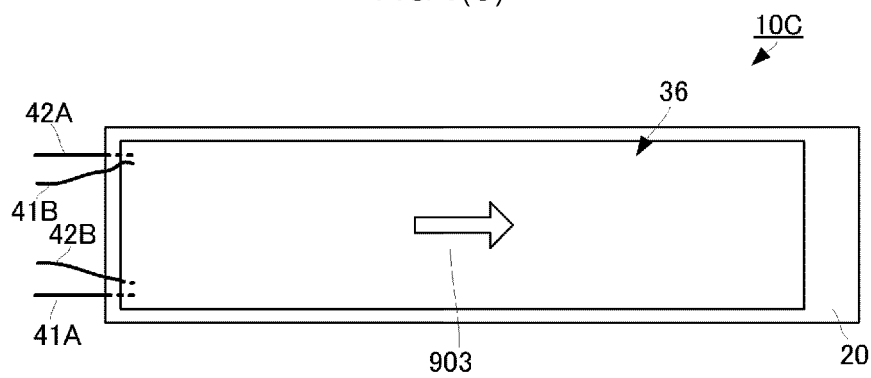

Next, a displacement sensor according to a fourth embodiment will be described with reference to the drawings. FIGS. 9A, 9B, and 9C are a plan view, a side view, and a rear view, respectively, of a displacement sensor 10C according to the fourth embodiment.

The displacement sensor 10C of the embodiment has the elastic member 20, a fifth piezoelectric element 35 corresponding to the first flat-film-shaped piezoelectric element of the present invention, and a sixth piezoelectric element 36 corresponding to a second flat-film-shaped piezoelectric element of the invention. The elastic member 20 is the same as that of the first embodiment and its description will not be repeated.

The fifth piezoelectric element 35 is attached to the first main face of the elastic member 20. The fifth piezoelectric element 35 has a piezoelectric sheet 350 having a rectangular shape. Like the piezoelectric sheet 300 of the first embodiment, the piezoelectric sheet 350 is formed so that 45° is formed between the uniaxial stretch direction and the long-side direction. Electrodes 351 and 352 are formed almost entirely on both faces of the piezoelectric sheet 350. The external connection terminal 41A is connected to the electrode 351, and the external connection terminal 42A is connected to the electrode 352.

The sixth piezoelectric element 36 is attached to the second main face opposed to the first main face of the elastic member 20. The sixth piezoelectric element 36 has a piezoelectric sheet 360 having a rectangular shape. The piezoelectric sheet 360 is formed so that the uniaxial stretch direction and the long-side direction are parallel to each other (the angle formed=zero degree).

The angle is not limited to exactly zero degree but may be about zero degree. The angle of "about zero degree" refers to an angle, for example, in a range of about ±10° of zero degree. The angles are design matters to be properly determined according to a general design including bending sensing precision on the basis of the use of the displacement sensor.

Electrodes 361 and 362 are formed almost entirely on both main faces of the piezoelectric sheet 360. The external connection terminal 41B is connected to the electrode 361, and the external connection terminal 42B is connected to the electrode 362.

The fifth and sixth piezoelectric elements 35 and 36 are attached to the elastic member 20 so that 45° is formed between the uniaxial stretch direction of the piezoelectric sheet 350 and the uniaxial stretch direction of the piezoelectric sheet 360, and the long-side direction (=the uniaxial stretch direction) of the piezoelectric sheet 360 is parallel to the long-side direction of the elastic member 20.

Figure 10A:
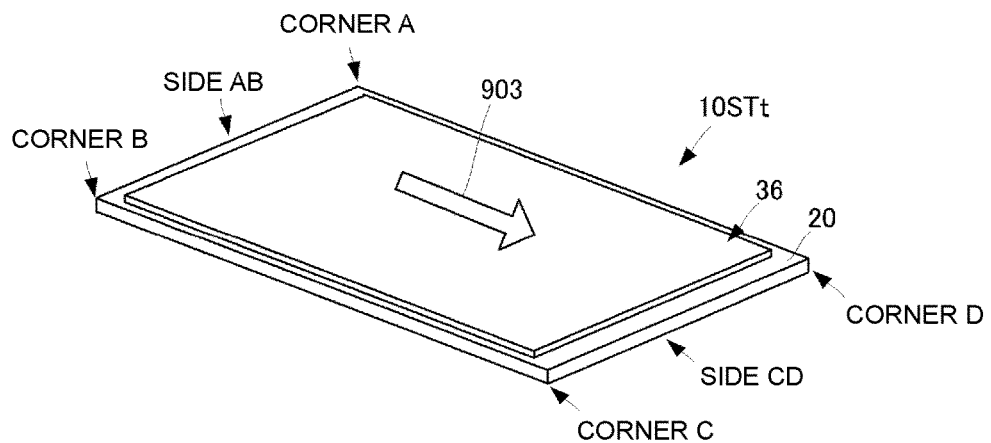
FIGS. 10A and 10B are diagrams illustrating shapes in an almost perspective view of a displacement sensor in a state where a twist displacement is zero and in a state where a predetermined twist displacement occurs.
Figure 10B:
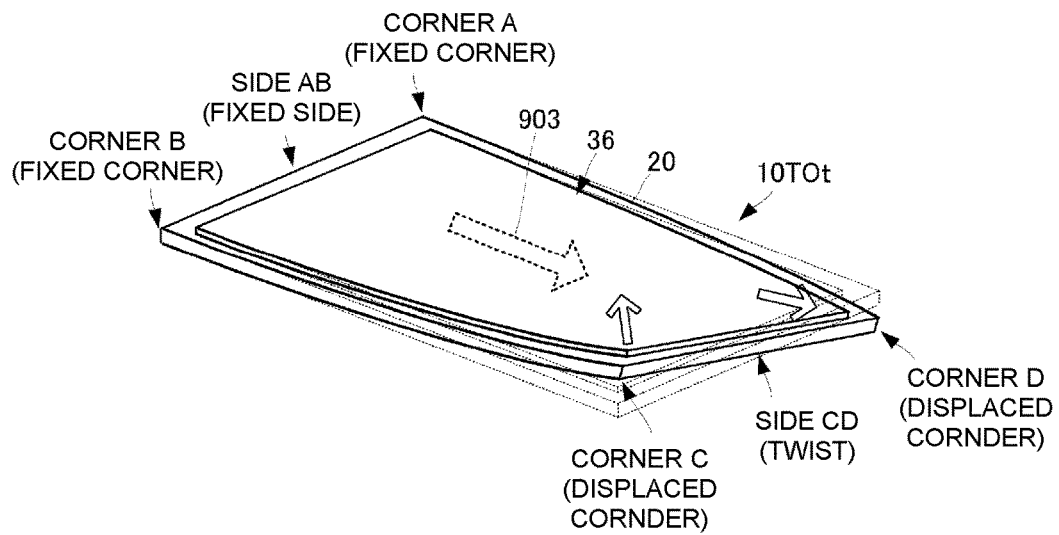

FIG. 10A is a diagram illustrating the shape in an almost perspective view of a displacement sensor in which only the sixth piezoelectric element 36 is disposed in a state where a twist displacement is zero, and FIG. 10B illustrates the shape in an almost perspective view of the displacement sensor in which only the sixth piezoelectric element 36 is disposed in a state where a predetermined twist displacement occurs. FIGS. 10A and 10B illustrates the displacement sensor in which only the sixth piezoelectric element 36 is disposed in the elastic member 20 to facilitate explanation of the diagrams and the principle. The principle can be applied also to the shape illustrated in FIGS. 9A to 9C. FIGS. 10A and 10B illustrate the case where the end side AB as one ends in the long-side direction of the elastic member 20 are defined as the fixed end side, and a twist occurs in the end side CD as the other end. In other words, they illustrate the case where corners A and B at both ends of the fixed end side AB are fixed corners, and corners C and D at both ends of the end side CD are displaced in directions almost perpendicular to the main face of the elastic member 20 and in directions opposite to each other.

In the case where a twist displacement is zero, that is, in the case where a force of causing a twist is not applied from the outside to the elastic member 20, the elastic member 20 is in a state where the main face is flat as illustrated by symbol 10STt in FIG. 10A. In this case, the sixth piezoelectric element 36 does not extend/contract, and no voltage is generated across the electrodes on the both faces of the sixth piezoelectric element 36.

In the case where a twist displacement has a predetermined value, that is, in the case where a force of causing a twist is not applied from the outside to the elastic member 20 and the end side CD opposed to the fixed end side AB of the elastic member 20 is twisted, the elastic member 20 is in a state where the corners C and D opposed to the fixed corners A and B are apart by predetermined distances in directions perpendicular to the main face (flat face) as compared with the state where the corners C and D opposed to the fixed corners A and B are flat as illustrated by symbol 10TOt in FIG. 10B. In this case, the corners C and D move in directions opposite to each other using the main face as a reference.

In this case, the sixth piezoelectric element 36 extends in the direction of 45° relative to the uniaxial stretch direction at and around the corner D and contracts in the direction of −45° relative to the uniaxial stretch direction at and around the corner C. Therefore, contraction/extension (refer to the arrows in solid line in FIG. 10B) occurs along the directions of −45° and +45° relative to the uniaxial stretch direction of the piezoelectric sheet 300 as a component of the sixth piezoelectric element 36, so that a voltage according to the amount of contraction/extension is generated across the electrodes as components in the sixth piezoelectric element 36. By detecting the voltage, the twist amount of the displacement sensor can be detected.

In the configuration, since the corners C and D are displaced by the equal amount in the directions opposite to each other, the voltage generated by the bending is cancelled out. Therefore, only the twist amount can be separated and detected at high precision.

As described above, by using the embodiment, the displacement of the bending is detected by the fifth piezoelectric element 35 attached to the first main face of the elastic member 20, and the displacement of the twist can be detected by the sixth piezoelectric element 36 attached to the second main face. The displacement of the bending and the displacement of the twist can be simultaneously and independently detected.

In the embodiment, the uniaxial stretch direction of the sixth piezoelectric element 36 for detecting a twist and the long-side direction of the elastic member 20 are parallel to each other. Alternatively, the sixth piezoelectric element 36 may be formed so that the uniaxial stretch direction of the sixth piezoelectric element 36 is perpendicular to the long-side direction, that is, in parallel to the short-side direction.

To the embodiment, the configuration of commonly using the electrode on the elastic member side described in the third embodiment can be also employed. In this case, the thin-type displacement sensor having a simplified configuration, resistive to noise due to external factors and capable of simultaneously detecting a bending and a twist can be realized.

Further, in the case of detecting only a twist as illustrated in FIGS. 10A and 10B, it is sufficient to form only the sixth piezoelectric element 36 in the elastic member 20.

In the configuration of disposing the piezoelectric elements for detecting displacements in the same direction on both main faces of the elastic member described in the second embodiment and the configuration of disposing the piezoelectric elements for detecting displacements in different directions on both main faces of the elastic member described in the fourth embodiment, when the strengths of the piezoelectric elements disposed on both main faces are the same, the elastic member may not be provided. In this case, the configuration of the displacement sensor can be simplified, and the thickness can be further reduced. However, to improve sensitivity of detection of a displacement, it is preferable to provide the elastic member.

In the case where it is sufficient to detect the presence/absence of a displacement which occurs in the displacement sensor without discriminating a bending and a twist, the angle formed between the long-side direction of the elastic member and the uniaxial stretch direction may be set to an angle other than 0°, 45°, and 90°. In this case, preferably, the angle formed between the long-side direction and the uniaxial stretch direction is set to about 22.5° and about 67.5°. Also in the case of setting the angle formed between the long-side direction of the elastic member and the uniaxial stretch direction to a range of about ±10° of 22.5° or a range of about ±10° of 67.5° on the basis of the use of the displacement sensor and in accordance with the design of the entire sensor, similar effects are obtained. In this case, the presence/absence of a displacement caused by the bending and the presence/absence of a displacement caused by a twist can be also detected by a single piezoelectric sheet of PLLA. Although the presence of a bending and a twist can be detected by a single sheet, by providing the piezoelectric elements on both faces of the elastic member, the output voltage can be doubled, and an average value of two output voltages can be obtained. Consequently, the presence of a bending and a twist can be detected more accurately.

By using polylactic acid and performing uniaxial stretch, various displacements can be freely and effectively detected in accordance with the orientation of the uniaxial stretch direction. Consequently, when the angle between the uniaxial stretch direction and the direction of a displacement desired to be detected (predetermined direction) is properly set, a displacement (for example, the bending, a twist, or the like) in a predetermined direction of the elastic member can be effectively detected. Specifically, since piezoelectricity of polylactic acid has anisotropy, not only a displacement in a piezoelectric sheet can be detected but also a displacement in a predetermined direction can be effectively detected.

In the foregoing embodiments, the configurations of detecting a displacement which occurs in the plate-shaped elastic member 20 have been described. As will be described in the following embodiment, a displacement in objects other than a flat plate can be also detected.

Figure 11:
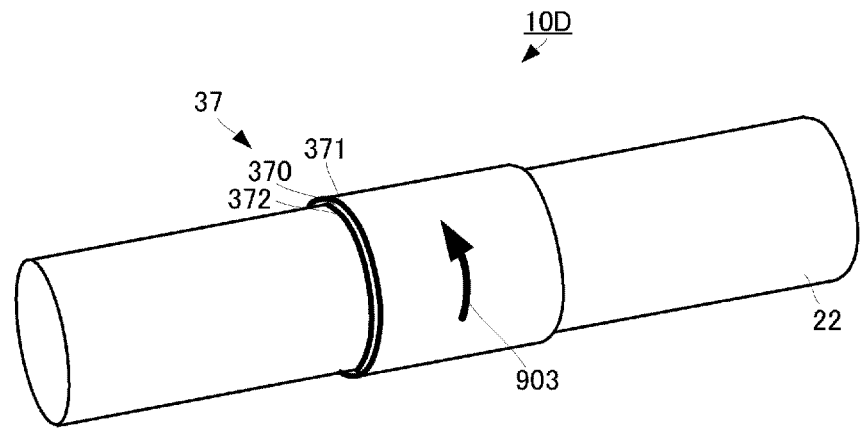
FIG. 11 is a diagram illustrating a state where a displacement sensor 10D according to a fifth embodiment is attached to a shaft 22.

A displacement sensor according to a fifth embodiment will be described with reference to the drawings. FIG. 11 is a diagram illustrating a state where a displacement sensor 10D of the embodiment is attached to a shaft 22.

The shaft 22 as an object to be detected has a columnar shape and rotates about its center axis (the center point of a circle in a section) as rotation center.

A piezoelectric element 37 as the displacement sensor 10D is attached to a circumferential face of the shaft 22.

The piezoelectric element 37 has a piezoelectric sheet 370 which is long and has a rectangular shape in a state where it is not attached to the shaft. The piezoelectric sheet 370 is formed so that its long-side direction is parallel to the uniaxial stretch direction. Electrodes 371 and 372 are formed on both main faces of the piezoelectric sheet 370. The electrodes 371 and 372 are connected to not-illustrated external connection terminals.

The piezoelectric element 37 having such a shape is attached so that its long-side direction coincides with the circumferential direction of the shaft 22. As a result, the uniaxial stretch direction (arrow symbol 903 in FIG. 11) and the circumferential direction coincide with each other. Although the length in the long-side direction of the piezoelectric element 37 may be shorter than that of the circumference of the shaft 22, preferably, the lengths are equal. The piezoelectric element 37 is adhered to the shaft 22 by an insulating adhesive. Preferably, the strength after fixation of the insulating adhesive is equal to or higher than that of the piezoelectric sheet 370 of the piezoelectric element 37.

With such a configuration, when a twist occurs in the shaft 22, the piezoelectric sheet 370 extends in a diagonal line direction, and the piezoelectric element 37 generates an output voltage according to the extension amount. Accordingly, the twist in the shaft 22 can be detected.

Although a single-layered piezoelectric element obtained by forming electrodes on both faces of a single piezoelectric sheet is used in each of the foregoing embodiments, a piezoelectric element obtained by stacking a plurality of single-layered piezoelectric elements may be also used. By using the structure in which a plurality of single-layers are stacked, an output voltage can be improved.

Although not described in detail in each of the foregoing embodiments, an insulating protection film may be formed so as to cover the surface of each piezoelectric element. In this case, a protection film whose Young's modulus is lower than that of the piezoelectric sheet as a component of the piezoelectric element is used. Further, it is sufficient to design so that a neutral point of a bending or a twist does not lie in the piezoelectric element by attachment of the protection film.

The displacement sensor having a flat film shape is used for the following various operation devices.

(i) Case of Game Operation Input Device (Game Controller)

Figure 12A:
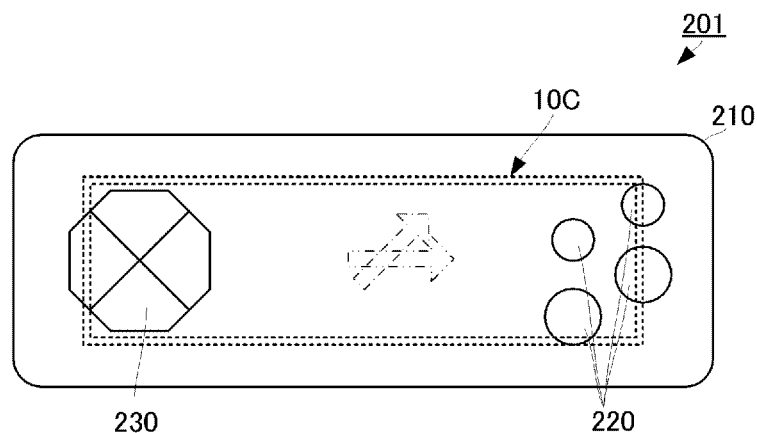
FIGS. 12A and 12B are diagrams illustrating a schematic configuration of a game controller 201 using the displacement sensor 10C.
Figure 12B:
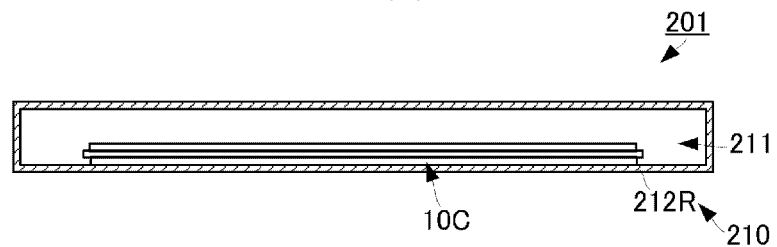
Figure 13A:
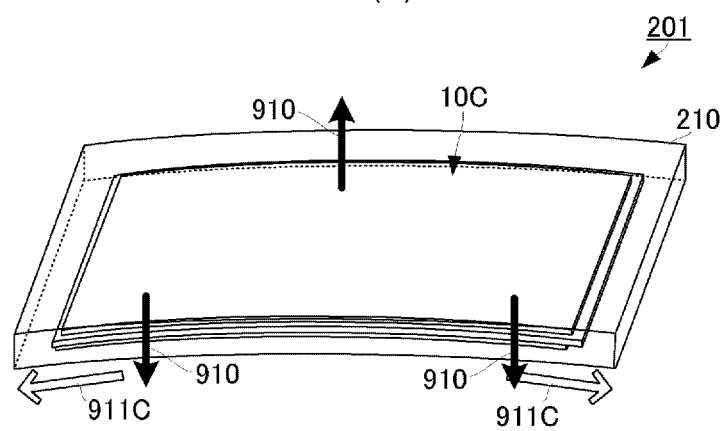
FIGS. 13A and 13B are diagrams illustrating a state where the game controller 201 is curved and a state where the game controller 201 is twisted, respectively.
Figure 13B:
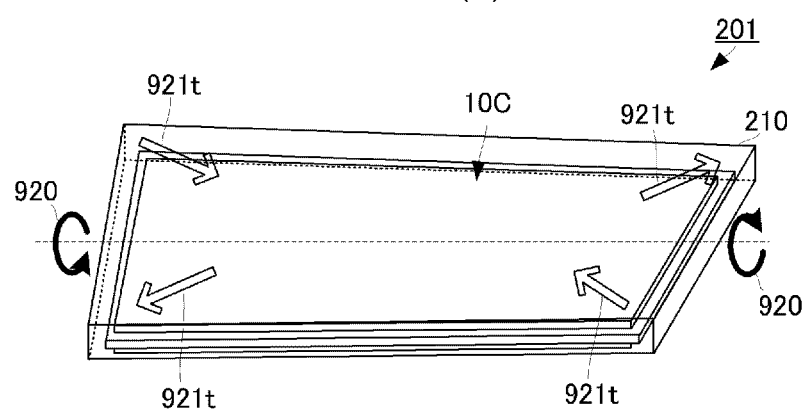

FIGS. 12A and 12B are diagrams illustrating a schematic configuration of a game controller 201 using the displacement sensor. FIG. 12A is a plan view, and FIG. 12B is a side sectional view. FIG. 13A illustrates a state where the game controller 201 is curved and FIG. 13B illustrates a state where the game controller 201 is twisted. In FIG. 13, the operation input buttons 220 and 230 are omitted, and a shape thereof is simplified.

The game controller 201 has a casing 210 having an almost rectangular shape. A plurality of operation input buttons 220 and 230 are disposed on the surface wall of the casing 210. The casing 210 has a space 211. In the space 211, operation detectors (not illustrated) for the operation input buttons 220 and 230 and a communication controller (not illustrated) for controlling communication with an external game machine body are provided.

On the space 211 side on the rear face wall of the casing 210, the displacement sensor 10C described in the fourth embodiment is disposed. The displacement sensor 10C is disposed so that its long-side direction almost coincides with the long-side direction of the casing 210.

The casing 210 is formed of a material which has predetermined elasticity and can be curved or twisted by the user.

To the casing 210 of the game controller 201 having such a structure, the user applies an external force so that, as illustrated by symbol 910 in FIG. 13A, the center in the long-side direction is displaced toward the surface side, and both ends in the long-side direction are displaced toward the rear face side. Consequently, the piezoelectric element having a flat film shape in each of the casing 210 and the displacement sensor 10C is curved along the long-side direction as illustrated by symbol 911C in FIG. 13A. As described above, the displacement sensor 10C detects such a curve in the long-side direction and generates detection voltage.

The not-illustrated communication controller obtains the detection voltage and transmits a command according to the detection voltage to the game machine body (corresponding to a "program executing unit" in the present invention). Accordingly, in the game machine, a process according to the controller bending operation of the user can be executed by a game program.

Subsequently, the user applies an external force to the casing 210 of the game controller 201 as illustrated by symbol 920 in FIG. 13B so that both ends in the long-side direction of the game controller 201 are turned in directions opposite to each other using the axis extending the center in the short-side direction, along the long-side direction of the game controller 201 as a reference axis. By the operation, each of the piezoelectric elements having a flat film shape of the casing 210 and the displacement sensor 10C contracts along one diagonal line and extends along the other diagonal line as illustrated by symbol 921*t* in FIG. 13B. As described above, the displacement sensor 10C detects such a twist and generates a detection voltage.

The not-illustrated communication controller obtains the detection voltage and transmits a command according to the detection voltage to the game machine body. Accordingly, in the game machine, a process according to the controller twisting operation of the user can be executed by a game program.

In this case, since the displacement sensor 10C uses PLLA as the piezoelectric sheet as described above, there is no pyroelectricity. Even when the user holds the game controller 201 and heat is conducted to the displacement sensor 10C, no influence is exerted on the detection voltage. Therefore, execution of an application in which the bending operation and the twist operation are accurately reflected can be realized.

Although the displacement sensor (provided in the game controller) and the application executing unit (game machine body) are provided separately, they may be also integrated.

Although the game controller has been described as an example, a similar configuration can be applied also to other portable operation input devices (such as remote controllers for various AV devices), and similar effects can be obtained. The operation for making a displacement occur in the displacement sensor is not limited to bending and twisting but may be any operation which can apply an external force to the displacement sensor such as touching, pressing, and vibrating.

(ii) Case of Wearable Item (Shoe) With Monitoring Function

Figure 14:
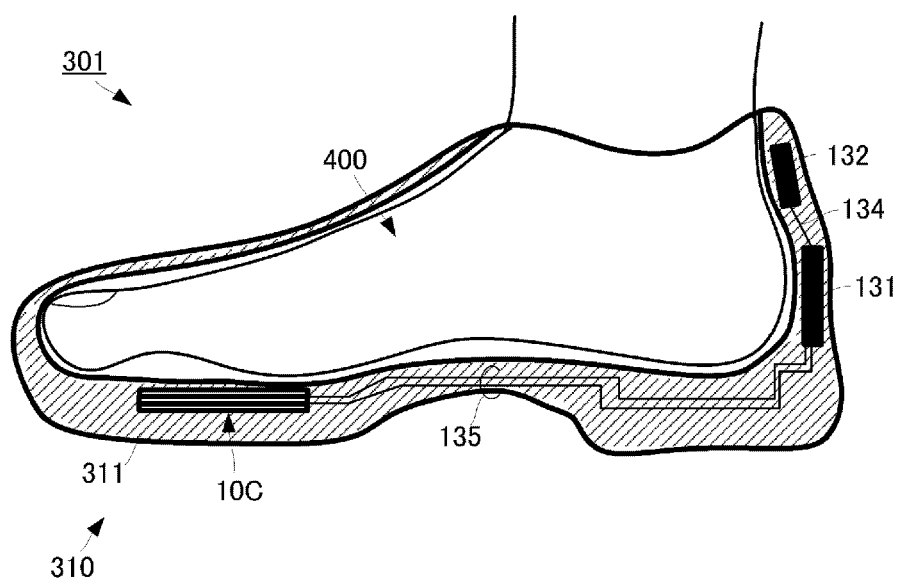
FIG. 14 is a diagram illustrating a schematic configuration of a shoe 300 with a monitoring function using the displacement sensor 10C.

FIG. 14 is a diagram illustrating a schematic configuration of a shoe 301 with a monitoring function using the above-described displacement sensor. In the shoe 301 with the monitoring function, the displacement sensor 10C is buried in a sole 311 of a shoe body 310. The displacement sensor 10C is disposed so that its main surface is almost parallel to the rear face of a foot 400 of the user, that is, the surface of the sole 311. Although FIG. 14 illustrates the example of disposing the displacement sensor 10C around the base of the toes, the displacement sensor 10C may be disposed around the arch of the foot, the heel, or the like. Obviously, the displacement sensors 10C may be disposed in a plurality of places.

The displacement sensor 10C is connected to a communication control unit 131 via a wiring line 135 also disposed in the sole 311. The communication control unit 131 is constructed by, for example, a microprocessor, and power is supplied from a battery 132 via a power supply line 134. The communication control unit 131 transmits a detection voltage based on the bending or twist of the displacement sensor 10C to an external display device or the like (corresponding to a "program executing unit" of the present invention).

With such a configuration, in the case where the user walks, jogs, or the like, the tilt of the bottom of each of the shoes at the time of landing and a ground striking posture of the user can be detected by the displacement sensor 10C. Consequently, a walking condition and a running condition of the user can be accurately detected and can be used for, for example, correction of a walking form or a jogging form of the user.

By employing the displacement sensor 10C using the flat-film-shaped PLLA, without increasing the thickness of the sole, the weight can be decreased as compared with the case of using a conventional ceramic piezoelectric member (PZT). In addition, since PLLA has flexibility, by making the electrodes formed on the surface of an organic material having flexibility similar to that of PLLA, the sensor is not broken by load or impact from the foot at the time of jogging or walking. Since PLLA is used, the environment load can be also lessened.

Although FIG. 13 illustrates the mode of burying the displacement sensor 10C in the sole 311 of the shoe body 310, a mode of burying the displacement sensor 10C in a detachable inner sole may be also employed.

The program executing unit is not limited to an external display device or the like. It is also possible to provide a pedometer, a voice generator, and the like in a shoe, and execute a program using a detection voltage of the displacement sensor.

In the application examples of (i) and (ii), the cases each using the displacement sensor capable of individually detecting a bending and a twist have been described. In the case of detecting one of a bending and a twist or in the case of detecting only the presence/absence of a bending and a twist, the displacement sensor described in the other embodiment can be also used.

(iii) Case of Remote Controller

Figure 15A:
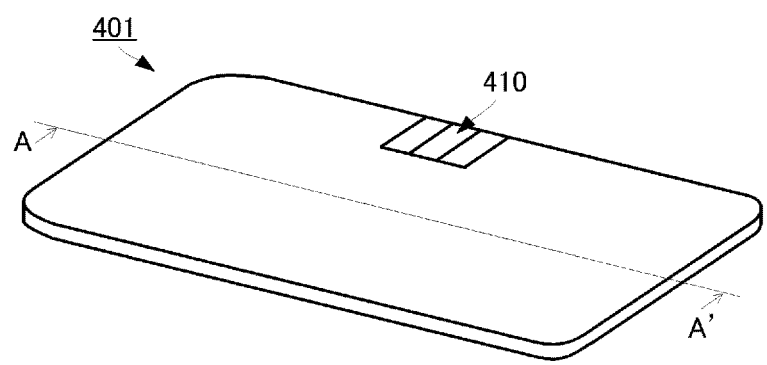
FIGS. 15A and 15B are diagrams illustrating a schematic configuration of a remote controller 401 using the displacement sensor.
Figure 15B:
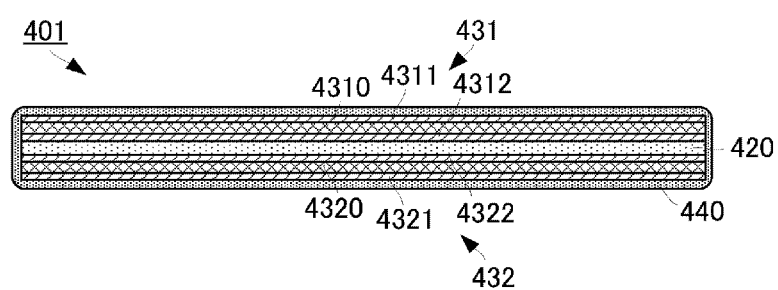

FIGS. 15A and 15B are diagrams illustrating a schematic configuration of a remote controller 401 using the displacement sensor. FIG. 15A is an appearance perspective view and FIG. 15B is a cross section of A-A' of FIG. 15A.

As the basic structure, the remote controller 401 uses the structure of the displacement sensor 10C described in the fourth embodiment. Therefore, only a schematic structure will be described.

A flat-film-shaped piezoelectric element 431 is disposed on a first main face of a flat-plate-shaped elastic member 420 made of transparent acrylic or the like. The piezoelectric element 431 has a flat-film-shaped piezoelectric sheet 4310 made of PLLA, and electrodes 4311 and 4312 are formed on both opposed main faces of the piezoelectric sheet 4310.

A flat-film-shaped piezoelectric element 432 is disposed on a second main face of the elastic member 420. The piezoelectric element 432 has a flat-film-shaped piezoelectric sheet 4320 made of PLLA, and electrodes 4321 and 4322 are formed on both opposed main faces of the piezoelectric sheet 4320.

A control circuit part 410 is formed so as to be connected to the electrodes of the composite structure having such a configuration. The control circuit part 410 is formed, for example, on the surface of the electrode 4311 as a component of the piezoelectric element 431 via a not-illustrated insulator layer. The control circuit part 410 has a battery, the above-described voltage detection circuit, and a transmission controller for transmitting a signal to an external device by infrared rays.

The elastic member 420, the piezoelectric elements 431 and 432, and the control circuit part 410 are entirely covered with an insulating protection layer 440.

With such a structure, only by simply bending or twisting the body of the remote controller 401, various control signals according to the bending and twisting can be transmitted. Concretely, in the case of employing a television apparatus (TV apparatus) as the application execution unit of the operation device and using the remote controller 401 as a remote controller provided to the TV apparatus, for example, a detection voltage generated by a bending is used for a control signal for switching channels, and a detection voltage generated by a twist can be used for a control signal for adjusting volumes.

More concretely, for example, settings are made as follows. When the remote controller 401 is bent so that the piezoelectric element 431 side extends and the piezoelectric element 432 side contracts, the channel is incremented by one (+1). When the remote controller 401 is bent so that the piezoelectric element 431 side contracts and the piezoelectric element 432 side extends, the channel is decremented by one (−1). In the case where one end in the long-side direction is twisted clockwise and the other end is twisted counterclockwise, the volume is increased by one (+1). In the case where one end in the long-side direction is twisted counterclockwise and the other end is twisted clockwise, the volume is decreased by one (+1). It is also possible to vary the addition amount and the subtraction amount of channels and volumes in accordance with the bending amount and the twisting amount.

Since the displacement sensor of the remote controller 401 having the above-described structure can output a detection voltage of the voltage level according to a pressing force and press time, channel continuous switching speed and increase/decrease of the volume adjustment amount can be also adjusted according to a pressing force and press time.

Further, a combination of detection voltages according to a bending and a twist can be used as a control signal for controlling power supply.

More concretely, settings are made as follows. In the case of continuously performing bending and twisting when the power of the TV apparatus is in an off state, the power is turned on. In the case of continuously performing the above-described two kinds of twists when the power of the TV apparatus is in an on state, the power is turned off.

With the above-described configuration, the user can perform the power supply control, channel switching, and volume adjustment only by the sensation of a hand without recognizing the position of a button in a conventional manner. Therefore, elderly people and visually impaired people (for example, who listens to only sound of a TV program) can also easily perform the power supply control, channel switching, and volume adjustment.

Since no buttons are necessary, the degree of freedom in designing of the remote controller improves. Further, when the color is transparent, a more innovative remote controller can be realized. For example, a remote controller which is fashionable and has a neo-futuristic image can be realized.

By using a button battery or a polymer battery as the battery used for the control circuit part 410, the control circuit part 410 can be miniaturized, and deterioration in design of the remote controller can be suppressed.

Although a TV apparatus is used as an example in the application example (iii), the invention can be applied also to a remote controller of any of other AV devices such as a magnetic recording/reproducing device, an optical disk recording/reproducing device, and an audio player.

(iv) Case of Touch Panel Sensor

Figure 16A:
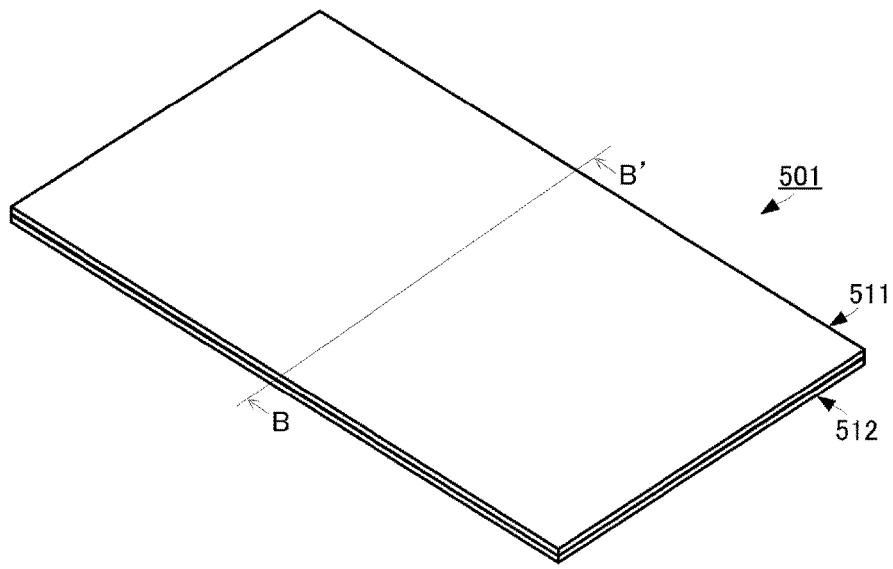
FIGS. 16A and 16B are diagrams illustrating a schematic configuration of a touch panel sensor 501 using the displacement sensor.
Figure 16B:
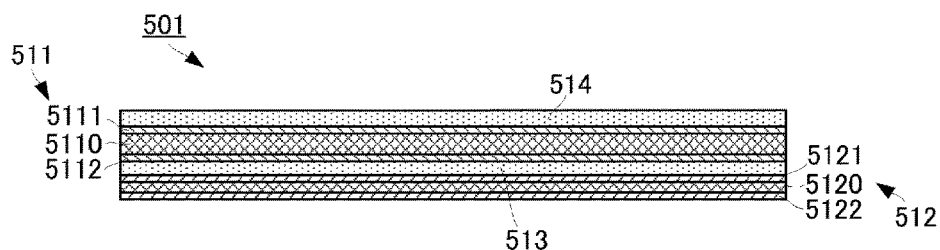

FIGS. 16A and 16B are diagrams illustrating a schematic configuration of a touch panel sensor 501 using the above-described displacement sensor. FIG. 16A is an appearance perspective view, and FIG. 16B is a cross section of B-B' of FIG. 16A.

The touch panel sensor 501 has a structure in which a touch panel part 511 having a flat plate shape and a piezoelectric element 512 having a flat plate shape are stacked so that their flat plate faces (main faces) are parallel to each other.

The piezoelectric element 512 has a flat-film-shaped piezoelectric sheet 5120 made of PLLA. Press force detecting electrodes 5121 and 5122 are formed on both opposed main faces of the piezoelectric sheet 5120.

On the surface of the press force detecting electrode 5121 of the piezoelectric element 512 (the face on the side opposite to the piezoelectric sheet 5120), an insulating layer 513 made of an elastic material is stacked.

On the face on the side opposite to the piezoelectric element 512 of the insulating layer 513, the touch panel part 511 is stacked. The touch panel part 511 has a base material layer 5110 made of dielectric having predetermined dielectric constant, and capacitance detecting electrodes 5111 and 5112 are formed on both main faces of the base material layer 5110. The surface of the capacitance detecting electrode 5112 of the touch panel part 511 (the face on the side opposite to the base material layer 5110) is in contact with the insulating layer 513.

An insulative protection layer 514 is stacked on the surface of the capacitance detecting electrode 5111 (the face on the side opposite to the base material layer 5110) of the touch panel part 511.

With such a structure, the touch panel sensor 501 using the insulative protection layer 514 side as the user interface side is configured.

In the case where a press force is applied from the outside, the flat plate face (main face) of the touch panel sensor 501 is curved to a degree that it is not easily visibly recognized. Therefore, the piezoelectric sheet 5120 of the piezoelectric element 512 is also curved, and the piezoelectric element 512 can output a detection voltage according to the curve amount, that is, the press force. Consequently, by using the touch panel sensor 501, the operation position (press position) is detected and the press force can be also simultaneously detected.

Therefore, by using the touch panel sensor 501 for remote controllers of various AV devices, control according to a press position and a press force can be performed. For example, in the case where a volume adjustment position is pressed, the volume adjustment speed can be changed according to the press force. When a fast-forward or rewind operation position is pressed, control of performing fast-forwarding or rewinding operation at a speed according to the press force can be performed.

Although the example of using the touch panel part 511 as the user interface side has been described in (iv), in the case where the touch panel part 511 is a resistive touch panel, the piezoelectric element 512 may be used as the user interface side.

Figure 17:
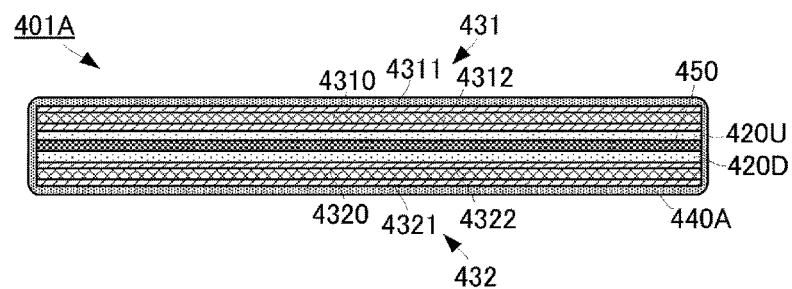
FIG. 17 is a side sectional view of a remote controller 401A having another configuration.

In a mode of using the flat-film-shaped displacement sensor for various operation devices, the structure illustrated in FIG. 17 can be used for devices such as the game controller 201, the remote controller 401, and the touch panel sensor 501 which are used in a condition that they are irradiated with sunlight or other light waves having a wavelength similar to that of the sunlight. FIG. 17 is a side sectional view of a remote controller 401A having a solar battery 450. Although a remote controller is illustrated as an example in FIG. 17, the configuration of FIG. 17 can be used for other operation input devices such as a game controller and a touch panel sensor.

The remote controller 401A illustrated in FIG. 17 has the same configuration as that of the remote controller 401 illustrated in FIG. 15 except that a stack body of an elastic member 420U, the solar battery 450, and an elastic member 420D is used in place of the elastic member 420.

Each of the elastic members 420U and 420D has a flat film shape and is made of, for example, acrylic resin. Preferably, the elastic member on the wave receiving face side of the solar battery 450 is made of a material having high translucency.

The solar battery 450 has a flat film shape and is made of a material having flexibility. The solar battery 450 is sandwiched between the elastic members 420U and 420D so that the flat faces match. Although a solar battery is used, a flat-film-shaped device having a charging unit (secondary battery) capable of receiving light waves, generating electromotive force, and charging the generated electromotive force may be also used.

The flat-film-shaped piezoelectric element 431 is disposed on the face on the side opposite to the solar battery 450 in the elastic member 420U. The flat-film-shaped piezoelectric element 432 is disposed on the face on the side opposite to the solar battery 450 in the elastic member 420D.

The complex stack body in which the piezoelectric element 432, the elastic member 420D, the solar battery 450, the elastic member 420U, and the piezoelectric element 431 are stacked in this order is covered with a protection layer 440A.

With such a configuration, a control signal can be generated by the electromotive force generated by the solar battery 450 which receives sunlight and power from the secondary battery charged with the electromotive force. In such a manner, a remote controller which does not have a general chemical-reaction-type battery such as a nickel battery can be realized. Obviously, a chemical-reaction-type battery (button cell) or the like can be also provided. By also providing a chemical-reaction-type battery, also in the case where charging of the solar battery is insufficient, a control signal can be output.

Although the configuration of sandwiching the solar battery 350 between the elastic members 420U and 420D has been described, the solar battery 350 may be disposed on the surface side of the remote controller 401A. With a configuration of sandwiching the solar battery 350 between the elastic members 420U and 420D, the layer of the solar battery 350 can be used as a neutral layer of a bending and a twist, so that a displacement can be detected more reliably. Although the solar battery 350 is disposed on the entire face in plan view of the remote controller 401A in the above-described configuration, it can be also partly disposed.

A function unit for connecting the secondary battery and an electrode for outputting detection voltage of the piezoelectric element and charging the secondary battery with a part of the detection voltage may be also provided. When such a function unit is provided, in the case where detection voltage equal to or higher than the voltage level sufficient to generate a control signal of the remote controller 401A is obtained, an excess voltage amount can be charged to the secondary battery. Particularly, in the mode of disposing the piezoelectric sheets 4311 and 4321 of the piezoelectric elements 431 and 432 on almost entire faces of the flat-film-shaped elastic members 420U and 420D, the detection voltage can be made larger, and it is suitable for the configuration in which the secondary battery can be charged. It is more preferable to use PLLA for the piezoelectric sheets as described above.

In a very preferable mode in each of the foregoing embodiments, the piezoelectric element in which the piezoelectric sheet is made of PLLA is used as the displacement sensor. From the viewpoint of detecting a bending or a twist and using it for a control signal, a displacement sensor made of any of other materials having piezoelectricity and a displacement sensor made of a material having no piezoelectricity to be described below can be also used.

The other materials having piezoelectricity include a material using piezoelectric constant $d_{14}$ and a material using piezoelectric constant $d_{31}$.

(A) The following materials use the piezoelectric constant $d_{14}$.
poly-γ-methyl-L-glutamate
poly-γ-benzyl-L-glutamate
cellulose
collagen
poly-D-propylene oxide
PDLA (poly-D-lactic acid)

With those materials using the piezoelectric constant $d_{14}$, the displacement sensors and various devices can be realized with a structure similar to that of the piezoelectric element using PLLA described above.

(B) Materials using the piezoelectric constant $d_{31}$ include the following poled polymers, ferroelectric polymers, and inorganic materials.

<Poled polymers>
nylon 11
polyvinyl fluoride
polyvinyl chloride
vinylidene cyanide—vinyl acetate copolymer
poly uric acid
<Ferroelectric polymers>
polyvinylidene fluoride
vinylidene fluoride—trifluoroethylene copolymer
<Inorganic materials>
barium titanate ($BaTiO_3$)
crystal ($SiO_2$)
lead zirconate titanate (PZT)
zinc oxide (ZnO)

(C) Displacement Sensor Made of Material Having No Piezoelectricity

Figure 18A:
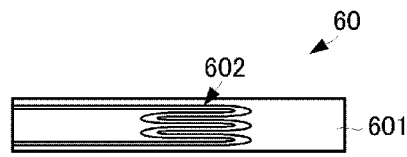
FIGS. 18A and 18B are diagrams illustrating a schematic configuration of a displacement sensor made of a material having no piezoelectricity and the concept of displacement detection.
Figure 18B:
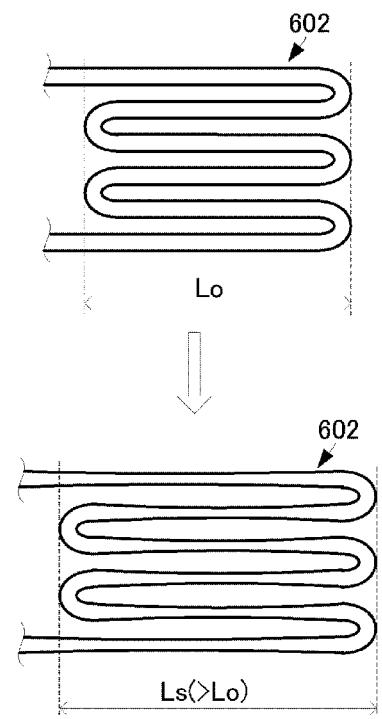

FIGS. 18A and 18B are diagrams illustrating a schematic configuration of a displacement sensor 60 made of a material having no piezoelectricity and the concept of displacement detection. FIG. 18A is a plan view of the displacement sensor 60, and FIG. 18B is an enlarged view for explaining the displacement detection concept.

As illustrated in FIG. 18A, the displacement sensor 60 has an elastic member 601 and a displacement detection electrode 602. The elastic member 601 is made by a polymer film or the like, has a flat film shape, and has insulation property.

The displacement detection electrode 602 is formed on one of the main faces of the elastic member 601. The displacement detection electrode 602 has a meander electrode and a lead electrode for connecting the meander electrode to the outside. When a displacement of the elastic member 601 occurs along the long-side direction of the elastic member 601, in the displacement detection electrode 602, a plurality of straight parts in the meander electrode become longer as shown in FIG. 18B. Specifically, each of the straight parts in the meander electrode, having length Lo along the long-side direction of the elastic member 601 before a displacement occurs along the long-side direction in the elastic member 601 changes to length Ls (>Lo). Accordingly, each of the straight parts in the meander electrode is also narrowed. Therefore, the resistance value of the meander electrode of the displacement detection electrode 602 changes according to a displacement. By detecting the change in the resistance value, the displacement of an object whose displacement is to be detected can be detected.

Figure 19:
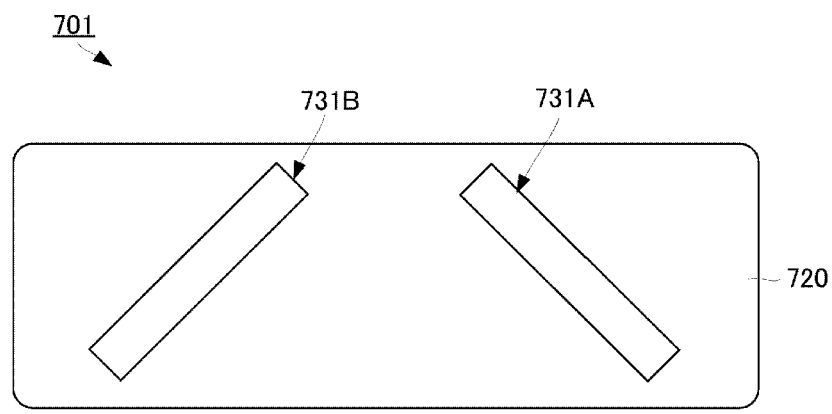
FIG. 19 is a plan view illustrating a mode of mounting a displacement sensor for detecting a twist in a plate-shaped device.

In the case of using displacement sensors in the groups (B) and (C), it is sufficient to properly install a displacement sensor in accordance with a direction of detection to a displacement detection object (a bending direction or a twist direction). For example, in the case of detecting a twist in a flat-plate-shaped device (such as the remote controller) as a displacement detection object, it is sufficient to use the configuration as illustrated in FIG. 19. FIG. 19 is a plan view illustrating a mode of mounting a displacement sensor for detecting a twist in a plate-shaped device.

As illustrated in FIG. 19, a device 701 having a flat plate shape has a rectangular main body 720 having a flat plate shape (flat film shape), and rectangular piezoelectric elements 731A and 731B each having a flat film shape. The main body 720 is made of a material which is twisted by an external force, such as an elastic member. The piezoelectric elements 731A and 731B are disposed on the main face of the main body 720 so that displacement sensitivity to a twist in the main body 720 becomes higher. For example, concretely, in the case of FIG. 19, the piezoelectric elements 731A and 731B are disposed on the main body 720 so that the long-side direction of the piezoelectric elements 731A and 731B and the long-side direction of the main body 720 form an angle of about 45° when viewed from the direction orthogonal to the main face of the main body 720. The piezoelectric elements 731A and 731B are disposed on the main body 720 so that their long-side directions form an angle of about 90°.

With such a configuration, the displacement sensor in the groups (B) and (C) can realize a device (a remote controller or the like) for detecting a specific direction (bending or twist) and outputting a control signal according to the detected direction. The displacement sensors of PLLA and in the group (A) can be attached with the structure as illustrated in FIG. 19.

Figure 20A:
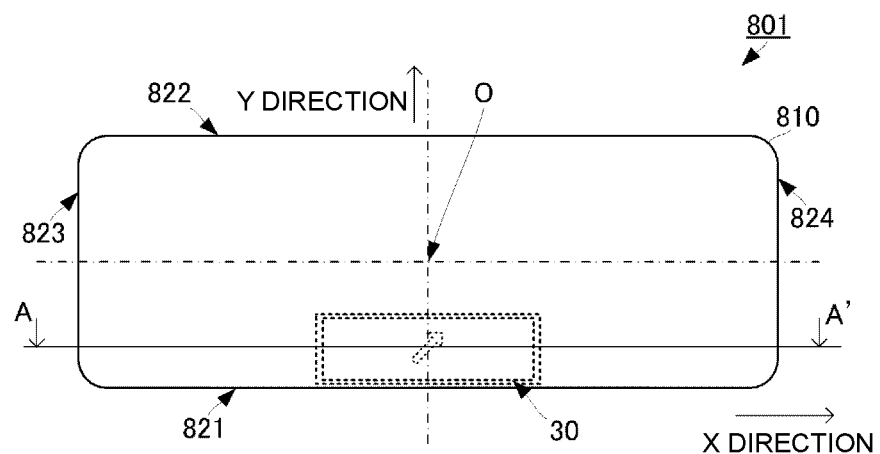
FIGS. 20A and 20B are diagrams illustrating disposition of a piezoelectric element 30 in an operation device 801.
Figure 20B:
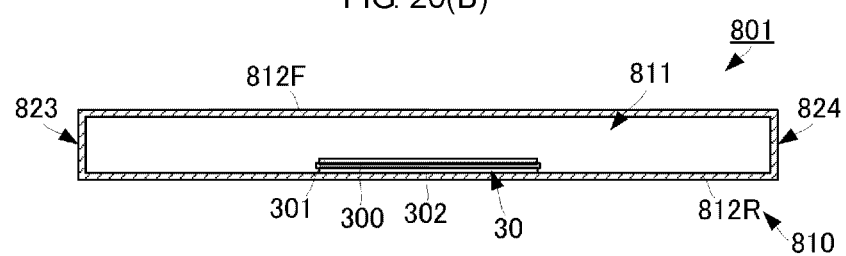

In the case of disposing a piezoelectric element in a casing to form an operation device like the game controller, the following mode can be also used. FIGS. 20A and 20B are diagrams illustrating disposition of the piezoelectric element 30 in an operation device 801. FIG. 20A is a plan view of the operation device 801, and FIG. 20B is a cross section of A-A' of FIG. 20A. In FIGS. 20A and 20B, only a casing 810 and the piezoelectric element 30 are illustrated. The other components of the operation device 801 are not illustrated.

The casing 810 has a rectangular parallelepiped shape which is long in one direction (hereinbelow, the direction will be called a long-side direction) and is short in a direction (hereinbelow, the direction will be called a short-side direction) orthogonal to the long-side direction. The casing 810 has a structure in which a surface wall 812F and a rear face wall 812R are opposed to each other over a gap. Long-side-direction side walls 821 and 822 and short-side-direction side walls 823 and 824 are formed along the outer periphery of the surface wall 812F and the outer periphery of the rear face wall 812R. With the structure, the casing 810 has an internal space 811. In the internal space 811, the piezoelectric element 30 is disposed together with not-illustrated various components of the operation device 801.

The piezoelectric element 30 is the same as the piezoelectric element 30 used for the displacement sensor 10 in the first embodiment.

Concretely, the piezoelectric element 30 has the rectangular piezoelectric sheet 300 having a flat film shape. The piezoelectric sheet 300 is made of PLLA. Although PLLA is used here, another material may be used as long as it has piezoelectric constant d14 and whose piezoelectricity has anisotropy. The piezoelectric sheet 300 is formed so that the uniaxial stretch direction forms an angle of 45° with respect to the long-side direction of the piezoelectric sheet 300.

The electrode 301 is formed on an almost entire first main face of the piezoelectric sheet 300. The electrode 302 is formed on an almost entire second main face of the piezoelectric sheet 300. As the material of the electrodes 301 and 302, any of the materials described in the first embodiment may be used. For example, any of an organic electrode whose main components are ITO, ZnO, and polythiophene, an organic electrode whose main component is polyaniline, a metal coated film formed by vapor deposition or plating, and a printed electrode film formed by silver paste may be used.

The flat-film-shaped piezoelectric element 30 having such a structure is disposed in an almost center in the long-side direction and near an end in the short-side direction in plan view of the casing 810. In the example of FIGS. 20A and 20B, the piezoelectric element 30 is disposed in a position near a center part of the long-side-direction side wall 821 and is in contact with the long-side-direction side wall 821 in the rear face wall 812R. In this case, the piezoelectric element 30 is disposed so that the side face in the long-side direction of the piezoelectric element 30 is in contact with the long-side-direction side wall 821. In other words, the piezoelectric element 30 is disposed in the casing 810 so that the long-side direction of the piezoelectric element 30 and that of the casing 810 almost coincide with each other.

By employing such a disposition structure of the piezoelectric element 30, a press in the surface wall 812F or the rear face wall 812R of the casing 810 can be efficiently detected by the following principle.

Figure 21:
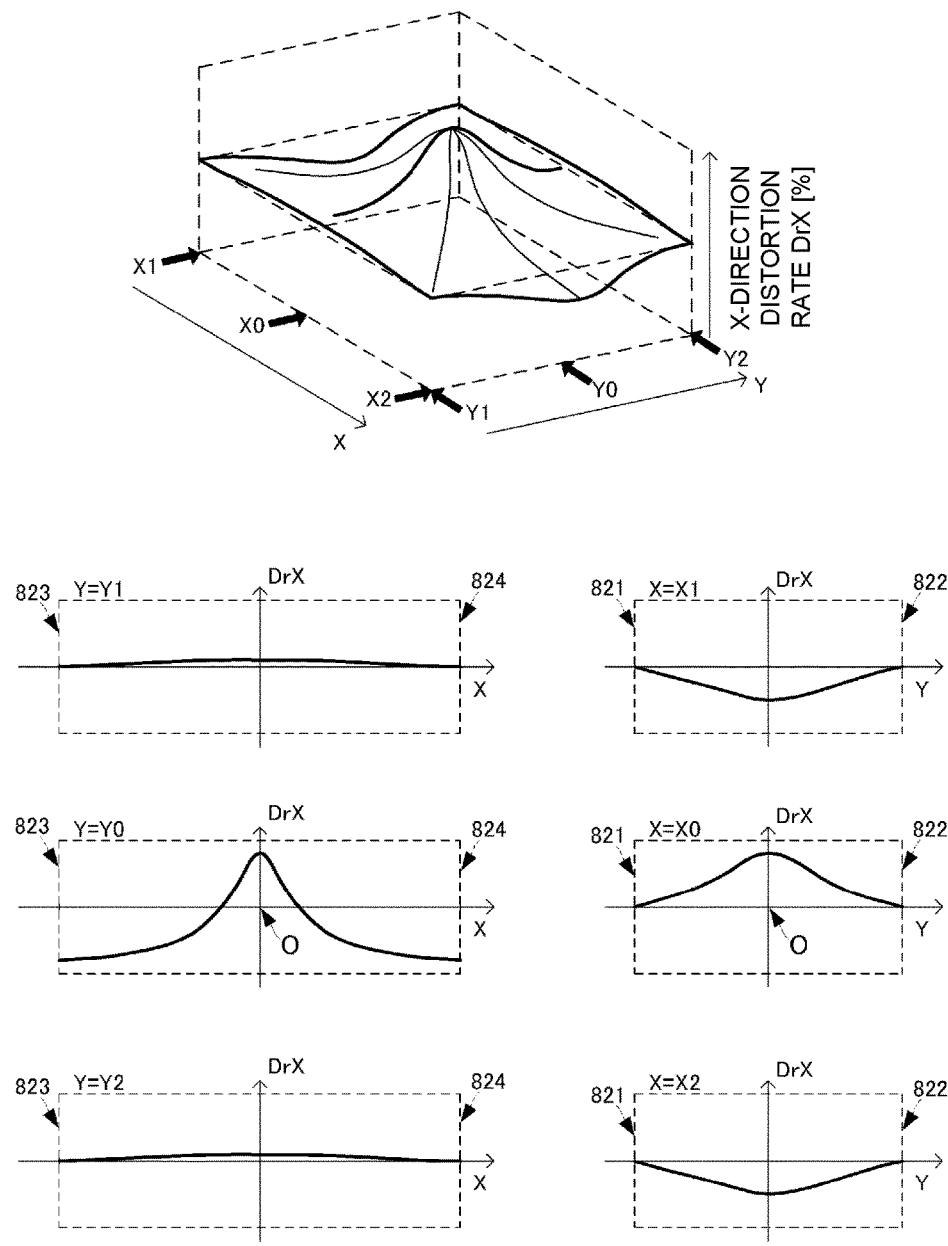
FIG. 21 is a distribution diagram of a distortion rate DrX in the long-side direction (X direction) of a casing 810 in the case where the center of a surface wall 812F of the casing 810 having a rectangular shape is pressed.
Figure 22:
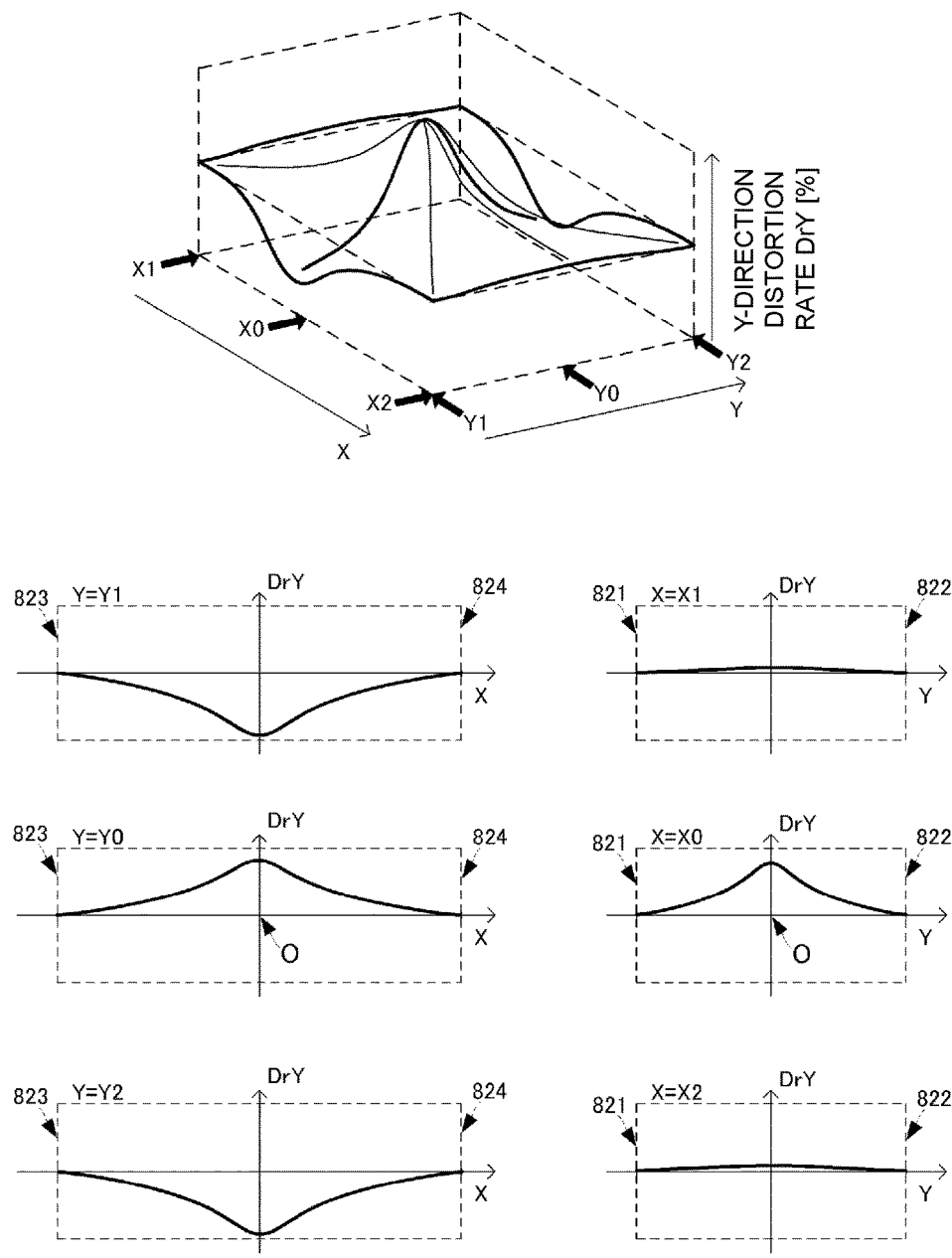
FIG. 22 is a distribution diagram of a distortion rate DrY in the short-side direction (Y direction) of the casing 810 in the case where the center of the surface wall 812F of the casing 810 having a rectangular shape is pressed.
Figure 23:
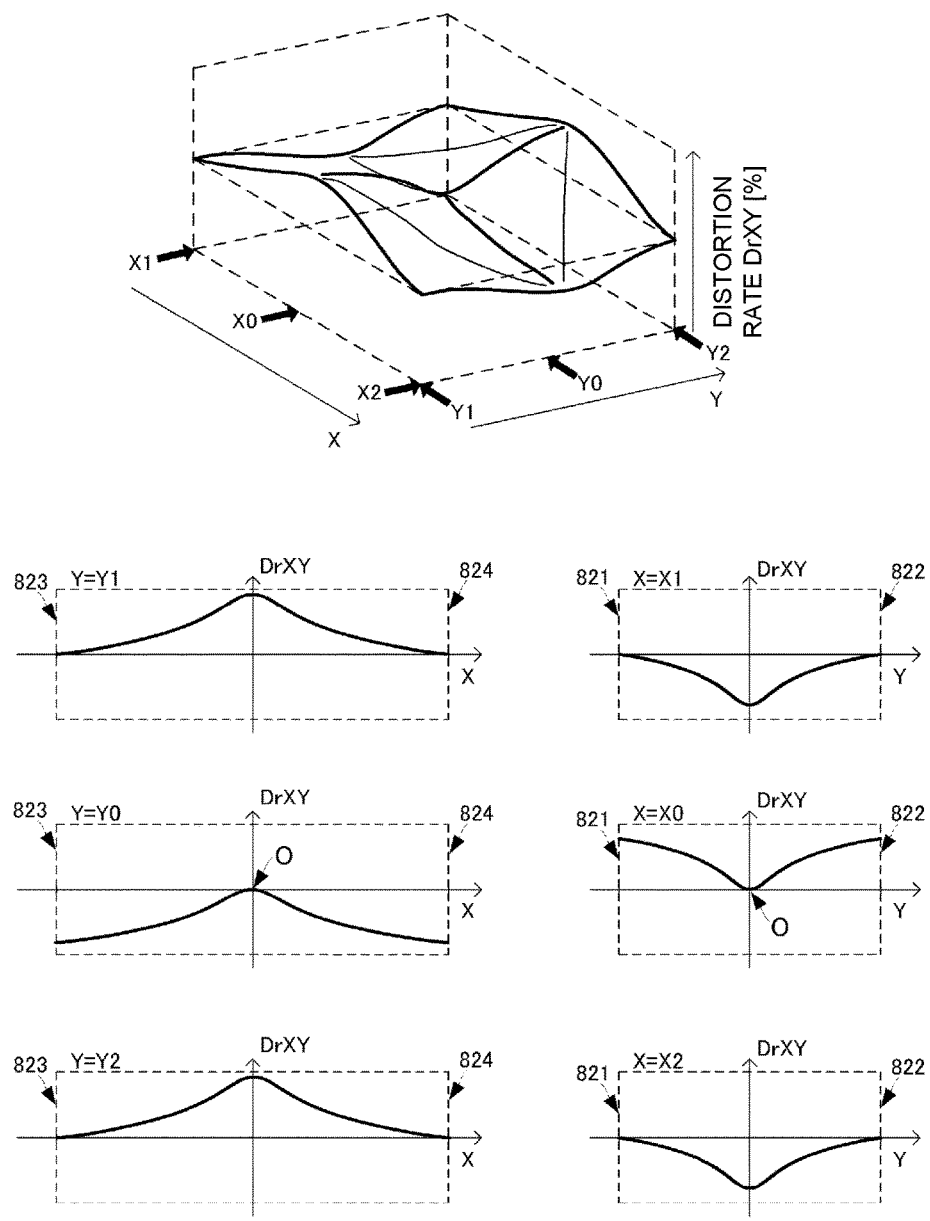
FIG. 23 is a distribution diagram of a distortion difference DrXY in the case where the center of the surface wall 812F of the casing 810 having a rectangular shape is pressed.

FIG. 21 is a distribution diagram of a distortion rate DrX in the long-side direction (X direction) of the casing 810 in the case where the center of the surface wall 812F of the casing 810 having a rectangular shape is pressed. FIG. 22 is a distribution diagram of a distortion rate DrY in the short-side direction (Y direction) of the casing 810 in the case where the center of the surface wall 812F of the casing 810 having a rectangular shape is pressed. FIG. 23 is a distribution diagram of a distortion difference DrXY in the case where the center of the surface wall 812F of the casing 810 having a rectangular shape is pressed. The distortion difference DrXY is calculated by the difference between the distortion rate DrX in the long-side direction and the distortion rate DrY in the short-side direction. In FIGS. 21, 22, and 23, XO corresponds to an intermediate part of the long-side-direction side walls 821 and 822 in FIG. 20. X1 corresponds to an end on the short-side-direction side wall 823 side of the long-side-direction side walls 821 and 822 in FIG. 20. X2 corresponds to an end on the short-side-direction side wall 824 side of the long-side-direction side walls 821 and 822 in FIG. 20. Y0 corresponds to an intermediate part of the short-side-direction side walls 823 and 824 in FIG. 20. Y1 corresponds to an end on the long-side-direction side wall 821 side of the short-side-direction side walls 823 and 824 in FIG. 20. Y2 corresponds to an end on the long-side-direction side wall 822 side of the short-side-direction side walls 823 and 824 in FIG. 20.

As illustrated in FIGS. 21 and 22, in the case of pressing the center of the surface wall 812F of the casing 810, the distortion rate DrX in the long-side direction and the distortion rate DrY in the short-side direction change according to positions. Concretely, they change as follows.

Distortion Rate DrX in Long-Side Direction (Refer to FIG. 21)

The distortion rate DrX in the long-side direction increases toward the "+" direction toward the center of the surface wall 812F regardless of the long-side and short-side directions. In regions close to the long-side-direction side walls 821 and 822, the distortion rate DrX in the long-side direction has a value close to "0" regardless of the position along the long-side direction. In this case, the distortion rate DrX is slightly "+" in the center in the long-side direction.

The distortion rate DrX in the long-side direction largely changes along the long-side direction in the center in the short-side direction. Concretely, it becomes largely "+" around the center and largely "−" at both ends (parts which are in contact with the short-side-direction side walls 823 and 824).

The distortion rate DrX in the long-side direction is "0" at the corners.

Distortion Rate DrY in Short-Side Direction (Refer to FIG. 22)

The distortion rate DrY in the short-side direction increases toward the "+" direction toward the center of the surface wall 812F regardless of the long-side and short-side directions. In regions close to the short-side-direction side walls 823 and 824, the distortion rate DrY in the short-side direction has a value close to "0" regardless of the position along the short-side direction. In this case, the distortion rate DrY is slightly "+" in the center in the short-side direction.

The distortion rate DrY in the short-side direction largely changes along the short-side direction in the center in the long-side direction. Concretely, it becomes largely "+" around the center and largely "−" at both ends (parts which are in contact with the long-side-direction side walls 821 and 822).

The distortion rate DrY in the short-side direction is "0" at the corners.

Therefore, as illustrated in FIG. 23, the distortion difference DrXY becomes almost "0" in the center of the surface wall 812F regardless of the long-side and short-side directions. The distortion difference DrXY becomes largely "+" in positions around the center in the long-side direction of the long-side-direction side walls 821 and 822 and close to the long-side-direction side walls 821 and 822. The distortion difference DrXY becomes largely "−" in positions around the center in the short-side direction of the short-side-direction side walls 823 and 824 and close to the short-side-direction side walls 823 and 824.

Since the piezoelectric sheet 300 of the piezoelectric element 30 has the piezoelectric constant d14, when the piezoelectric element 30 is disposed in the casing 810 so that the uniaxial stretch direction of the piezoelectric sheet 300 (the piezoelectric element 30) and the long-side and short-side directions of the casing 810 form an angle of 45°, by disposing the element in a region where the absolute value of the distortion difference DrXY is the largest, the voltage according to the press amount becomes high.

FIGS. 24A to 24F are diagrams illustrating examples of disposition of the piezoelectric element 30 in the casing 810. FIGS. 24A to 24F illustrate examples of disposing the piezoelectric elements 30 having the same shape in the casings 810 having the same shape. In FIGS. 24A to 24F, the point O denotes the center of the casing 810 in plan view. In each of the diagrams, the amount of charges generated by the piezoelectric element 30 in the case of pressing the point O from the surface wall 812F side is shown.

FIGS. 24A to 24F illustrate the case of using the casing 810 whose length in the long-side direction is 80 mm and whose length in the short-side direction is 60 mm, and the piezoelectric sheet 300 made of PLLA whose length in the long-side direction is 30 mm and whose length in the short-side direction is 10 mm. The amount of charges is indicated in the case of pressing the surface wall 812F with 1 kgf.

FIGS. 24A, 24B, and 24C illustrate the case where the long-side direction of the piezoelectric element 30 and that of the casing 810 are almost parallel to each other.

In the case of FIG. 24A, the piezoelectric element 30 is disposed in the center in the short-side direction of the casing 810 and in an intermediate position between the center of the long-side direction of the casing 810 and the short-side-direction side wall 823. In this case, the charge amount is +4.3 nC.

In the case of FIG. 24B, the piezoelectric element 30 is disposed in the center of the casing 810. In this case, the charge amount is +1.8 nC.

In the case of FIG. 24C, the piezoelectric element 30 is disposed in the center in the long-side direction of the casing 810 and in a position where it is in contact with the long-side-direction side wall 821 (end in the short-side direction). In this case, the charge amount is +7.0 nC. FIGS. 24D, 24E, and 24F illustrate the case where the long-side direction of the piezoelectric element 30 and that of the casing 810 are almost perpendicular to each other.

In the case of FIG. 24D, the piezoelectric element 30 is disposed in the center in the long-side direction of the casing 810 and between the center point O and the long-side-direction side wall 821. In this case, the charge amount is −4.0 nC.

In the case of FIG. 24E, the piezoelectric element 30 is disposed in the center of the casing 810. In this case, the charge amount is +0.61 nC.

In the case of FIG. 24F, the piezoelectric element 30 is disposed in the center in the short-side direction of the casing 810 and in a position where it is in contact with the short-side-direction side wall 823 (end in the long-side direction). In this case, the charge amount is +3.8 nC.

It is understood from the above that, in the case of disposing the piezoelectric element 30 in the casing 810, by disposing the piezoelectric element 30 in a region where the absolute value of the distortion difference DrXY is the largest, the charge amount having a larger absolute value can be obtained.

Therefore, as described above and as illustrated in FIG. 20, by disposing the piezoelectric element 30 in the casing 810, the output voltage sensitivity to pressing (displacement) can be improved. Accordingly, even when the size of the piezoelectric element 30 is regulated, the operation device having high sensitivity to the pressing operation can be realized.

The disposition mode illustrated in FIG. 20 is just an example. Another disposition mode may be used as long as the piezoelectric element 30 is disposed in a region where the absolute value of the distortion difference is large. In the case where regions of different signs ("+" and "−") mixedly exist in the region in which the piezoelectric element 30 is disposed, charges generated in the regions are cancelled out, so that the generation charge amount of the piezoelectric element 30 becomes smaller. Therefore, in the region in which the piezoelectric element 30 is disposed, preferably, the piezoelectric element 30 is disposed in the casing 810 so that charges (voltages) of the same sign are generated as possible, in other words, so that the polarities of charge distributions become the same.

Although FIG. 20 illustrates the example of disposing the piezoelectric element 30 in the region where the distortion difference is large. It is also possible to dispose the piezoelectric sheet entirely on the inside of the rear face wall 812R of the casing 810 and form an electrode only in the region where the distortion difference is large.

Figure 25:
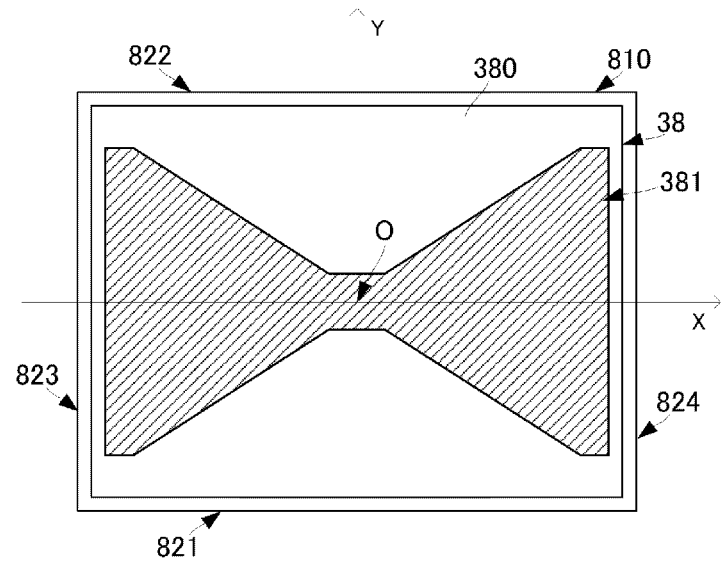
FIG. 25 is a plan view of the casing 810, illustrating an example of adhering a piezoelectric sheet 380 in an almost entire face of the casing 810.

FIG. 25 is a plan view of the casing 810, illustrating an example of adhering a piezoelectric sheet 380 in an almost entire face of the casing 810. The piezoelectric element 38 has the piezoelectric sheet 380 disposed in an almost entire face of an internal space in plan view of the casing 810 and an electrode 381 formed in a predetermined region in the piezoelectric sheet 380. On the face on the side opposite to the electrode 381 of the piezoelectric sheet 380, another electrode is formed so as to be opposed to the electrode 381.

The piezoelectric sheet 380 is formed so that the long-side direction and the short-side direction and the uniaxial stretch direction form an angle of about 45°.

The electrode 381 is formed in a shape in which the electrode width gradually increases along the long-side direction so that the electrode width in the center along the long-side direction (length along the short-side direction) is short and becomes long at both ends along the long-side direction. With such a configuration, the electrode 381 is formed in the entire region of the same sign ("−" sign), in which the distortion difference DrXY is large. Therefore, the output voltage sensitivity to pressing in the surface wall 812F of the casing 810 can be made higher.

Although FIG. 25 illustrates the example of disposing the piezoelectric sheet 380 on the almost entire face, a piezoelectric sheet having the same shape as that of the electrode 380 may be disposed. In this case, it is sufficient to cut out a piezoelectric sheet so that, when the piezoelectric element is disposed in the casing 810, the uniaxial stretch direction of the piezoelectric sheet forms an angle of about 45° with respect to the long-side direction and the short-side direction of the casing 810.

Figure 26:
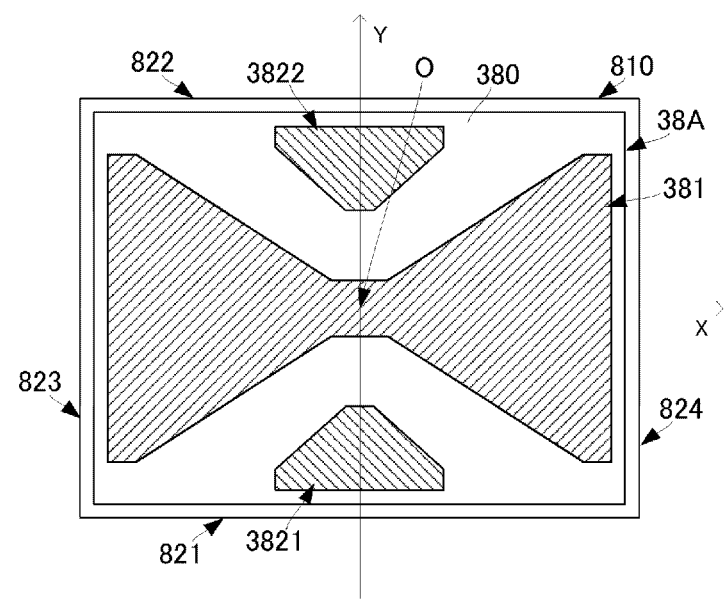
FIG. 26 is a plan view of the casing 810, illustrating an example of adhering the piezoelectric sheet 380 in an almost entire face of the casing 810 and forming a plurality of electrodes.

Further, as illustrated in FIG. 26, more electrodes may be formed. FIG. 26 is a plan view of the casing 810, illustrating an example of adhering the piezoelectric sheet 380 in an almost entire face of the casing 810 and forming a plurality of electrodes.

A piezoelectric element 38A is obtained by adding electrodes 3821 and 3822 to the piezoelectric element 38. The electrode 3821 is formed in a center part in the long-side direction of the piezoelectric sheet 380 and near one end in the short-side direction (region close to the long-side-direction side wall 821). The electrode 3822 is formed in a center part in the long-side direction of the piezoelectric sheet 380 and near the other end along the short-side direction (region close to the long-side-direction side wall 822). The electrodes 3821 and 3822 are not connected to the electrode 381. Although not illustrated, also on the face opposed to the piezoelectric sheet 380 of the electrodes 3821 and 3822, electrodes having the same shape are formed.

In the case of such a configuration, the sign of charges generated by the electrodes 3821 and 3822 is opposite to that of charges generated in the electrode 381 (the polarities of charge distributions are opposite). Therefore, if the charges are simply added, the total amount of the charges decreases. That is, when the voltage generated by the electrode 3821 and the voltage generated by the electrode 381 are simply added, the voltage decreases. Therefore, in the case of such a configuration, it is sufficient to provide a configuration of adding the voltages obtained by the electrodes 3821 and 3822 and the voltage obtained by the electrode 381 without cancelling them out (the voltages are added in a state where the polarities are the same). With such a configuration, the area of detecting charges is widened, and the output voltage sensitivity can be made higher.

In the embodiment of the operation device, the example of detecting pressing in the surface wall has been described. The invention can be also used for detecting pressing in the rear face wall.

In the diagrams, the dimensional relations are exaggerated for explanation. For example, in the sectional view of the stack body, the thickness of each of parts is not limited to the ratio illustrated in the diagram. The design can be properly changed within the range of the technical idea of the present invention.

DESCRIPTION OF REFERENCE SYMBOLS 10, 10A, 10B, 10C, 10D, 60: DISPLACEMENT SENSOR
20: ELASTIC MEMBER
30, 31, 32, 33, 34, 35, 36, 37, 38, 38A, 431, 432, 512: PIEZOELECTRIC ELEMENT
300, 310, 320, 330, 340, 350, 360, 370, 380, 4310, 4320, 5120: PIEZOELECTRIC SHEET
301, 302, 311, 312, 321, 322, 331, 341, 351, 352, 361, 362, 371, 372, 381, 3821, 3822, 4311, 4312, 4321, 4333: ELECTRODE
41, 42, 41A, 42A, 41B, 42B: EXTERNAL CONNECTION TERMINAL
100: DISPLACEMENT DETECTING DEVICE
101: DC VOLTAGE DETECTOR
201: GAME CONTROLLER
210: CASING
211: SPACE
220, 230: OPERATION INPUT BUTTON
301: SHOE WITH MONITORING FUNCTION
301: SHOE BODY
311: SOLE
131: COMMUNICATION CONTROL UNIT
132: BATTERY
134: POWER SUPPLY LINE
135: WIRING LINE
400: FOOT
401, 401A: REMOTE CONTROLLER
410: CONTROL CIRCUIT PART
420, 420D, 420U: ELASTIC MEMBER
440, 440A, 514: INSULATING PROTECTION LAYER
450: SOLAR BATTERY
501: TOUCH PANEL SENSOR
511: TOUCH PANEL PART
5111, 5112: CAPACITANCE DETECTING ELECTRODE
5121, 5122: PRESS FORCE DETECTING ELECTRODE
513: INSULATING LAYER
601: ELASTIC MEMBER
602: DISPLACEMENT DETECTION ELECTRODE
701: DEVICE HAVING FLAT PLATE SHAPE
720: MAIN BODY
731A, 731B: PIEZOELECTRIC ELEMENTS
801: OPERATION DEVICE
810: CASING
811: INTERNAL SPACE
812F: SURFACE WALL
812R: REAR FACE WALL
821, 822: LONG-SIDE-DIRECTION SIDE WALL
823, 824: SHORT-SIDE-DIRECTION SIDE WALL

The invention claimed is:

1. A displacement sensor comprising:
an elastic member;
a flat-film-shaped piezoelectric element, the piezoelectric element including a pair of opposed electrodes and a piezoelectric sheet therebetween;
a first insulating element arranged between a first main surface side of the piezoelectric element and the elastic member; and
a second insulating element arranged on a second main surface side of the piezoelectric element opposite to the first main surface side,
wherein the piezoelectric sheet contains polylactic acid and was stretched at least in a uniaxial direction thereof, and
wherein a Young's modulus of the second insulating element is higher than at least that of the piezoelectric sheet.

2. The displacement sensor according to claim 1, wherein the first insulating element is an adhesive adhering a first main surface of the of the piezoelectric element to the elastic member.

3. The displacement sensor according to claim 1, wherein the second insulating element is a protection film covering the piezoelectric element.

4. The displacement sensor according to claim 1, wherein the elastic member and the piezoelectric element are arranged relative to each other such that a neutral face of a bending of the piezoelectric element is a center axis in a thickness direction of the elastic member.

5. The displacement sensor according to claim 1, wherein the piezoelectric sheet is a substantially rectangular-shaped flat film, and wherein a stretch axis of the uniaxial direction is oriented along at least a direction of about 45° or a direction of about −45° with respect to a long-side direction of the substantially rectangular-shaped flat film.

6. The displacement sensor according to claim 1, wherein the piezoelectric sheet is a substantially rectangular-shaped flat film, and wherein a stretch axis of the uniaxial direction is oriented along at least a direction of about zero degree or a direction of about 90° with respect to a long-side direction of the substantially rectangular-shaped flat film.

7. The displacement sensor according to claim 1, wherein the piezoelectric sheet is a substantially rectangular-shaped flat film, and wherein a stretch axis of the uniaxial direction is oriented along at least a direction of about 22.5° or a direction of about 67.5° with respect to a long-side direction of the substantially rectangular-shaped flat film.

8. The displacement sensor according to claim 1, wherein the flat-film-shaped piezoelectric element attached to the first main face of the elastic member is a first flat-film-shaped piezoelectric element, the displacement sensor further comprising:
   a second flat-film-shaped piezoelectric element attached to a second main face opposed to the first main face of the elastic member, the second piezoelectric element including a pair of opposed electrodes with a piezoelectric sheet therebetween, and
   the piezoelectric sheet of the second flat-film-shaped piezoelectric element contains polylactic acid and was stretched at least in a uniaxial direction thereof.

9. The displacement sensor according to claim 8, wherein the piezoelectric sheet of the first flat-film-shaped piezoelectric element is a substantially rectangular-shaped first flat film, and wherein a stretch axis of the uniaxial direction is oriented along at least a direction of about 45° or a direction of about −45° with respect to a long-side direction of the substantially rectangular-shaped first flat film, and
   the piezoelectric sheet of the second flat-film-shaped piezoelectric element is a substantially rectangular-shaped second flat film, and wherein a stretch axis of the uniaxial direction is oriented along at least a direction of about zero degree or a direction of about 90° with respect to a long-side direction of the substantially rectangular-shaped second flat film.

10. The displacement sensor according to claim 8, wherein the piezoelectric sheet of the first flat-film-shaped piezoelectric element is a substantially rectangular-shaped first flat film, and wherein a stretch axis of the uniaxial direction is oriented along at least a direction of about 22.5° or a direction of about 67.5° with respect to a long-side direction of the substantially rectangular-shaped first flat film, and
   the piezoelectric sheet of the second flat-film-shaped piezoelectric element is a substantially rectangular-shaped second flat film, and wherein a stretch axis of the uniaxial direction is oriented along at least a direction of about 22.5° or a direction of about 67.5° with respect to a long-side direction of the substantially rectangular-shaped second flat film.

11. The displacement sensor according to claim 8, wherein the elastic member has conductivity, and
   an electrode on the elastic member side of the first flat-film-shaped piezoelectric element and an electrode on the elastic member side of the second flat-film-shaped piezoelectric element are shared by the elastic member having conductivity.

12. The displacement sensor according to claim 1, wherein the displacement sensor comprises a stacked plurality of the flat-film-shaped piezoelectric elements.

13. The displacement sensor according to claim 8, wherein the displacement sensor comprises a stacked plurality of at least one of the piezoelectric sheet of the first flat-film-shaped piezoelectric element or the piezoelectric sheet of the second flat-film-shaped piezoelectric element.

14. The displacement sensor according to claim 1, wherein the pair of electrodes and the elastic member are translucent.

* * * * *